(12) United States Patent
Lai et al.

(10) Patent No.: US 12,346,644 B2
(45) Date of Patent: *Jul. 1, 2025

(54) ARRANGEMENT OF SOURCE OR DRAIN CONDUCTORS OF TRANSISTOR

(71) Applicant: TAIWAN SEMICONDUCTOR MANUFACTURING COMPANY, LTD., Hsinchu (TW)

(72) Inventors: Chih-Yu Lai, Hsinchu (TW);
Chih-Liang Chen, Hsinchu (TW);
Chi-Yu Lu, Hsinchu (TW);
Shang-Hsuan Chiu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/522,906

(22) Filed: Nov. 29, 2023

(65) Prior Publication Data
US 2024/0095433 A1 Mar. 21, 2024

Related U.S. Application Data

(63) Continuation of application No. 17/525,173, filed on Nov. 12, 2021, now Pat. No. 11,853,670.

(51) Int. Cl.
| G06F 30/39 | (2020.01) |
| G06F 30/392 | (2020.01) |
| G06F 30/394 | (2020.01) |
| G06F 30/398 | (2020.01) |
| H10D 64/01 | (2025.01) |

(52) U.S. Cl.
CPC ............ *G06F 30/39* (2020.01); *G06F 30/392* (2020.01); *G06F 30/394* (2020.01); *G06F 30/398* (2020.01); *H10D 64/01* (2025.01)

(58) Field of Classification Search
CPC ...... G06F 30/39; G06F 30/392; G06F 30/394; G06F 30/398; H01L 29/401; H01L 27/092; H01L 27/0207; H01L 29/775
See application file for complete search history.

(56) References Cited

U.S. PATENT DOCUMENTS

| 7,260,442 | B2 | 8/2007 | Hwang et al. |
| 9,256,709 | B2 | 2/2016 | Yu et al. |
| 2014/0040838 | A1 | 2/2014 | Liu et al. |
| 2015/0278429 | A1 | 10/2015 | Chang |
| 2021/0343696 | A1* | 11/2021 | Chae .................... H01L 23/5286 |
| 2022/0045050 | A1* | 2/2022 | Kim .................... H01L 29/66666 |
| 2023/0268336 | A1* | 8/2023 | Chae .................... H01L 27/0207 257/296 |

* cited by examiner

*Primary Examiner* — Daniel D Chang
(74) *Attorney, Agent, or Firm* — Hauptman Ham, LLP

(57) ABSTRACT

An integrated circuit includes a first conductor segment intersecting a first active-region structure at a source/drain region and a second conductor segment intersecting a second active-region structure at a source/drain region. The first conductor segment and the second conductor segment are separated at proximal edges by a separation distance. A distance from a first horizontal cell boundary to a proximal edge of the first conductor segment is larger than a distance from a second horizontal cell boundary to a proximal edge of the second conductor segment by a predetermined distance that is a fraction of the separation distance.

20 Claims, 21 Drawing Sheets

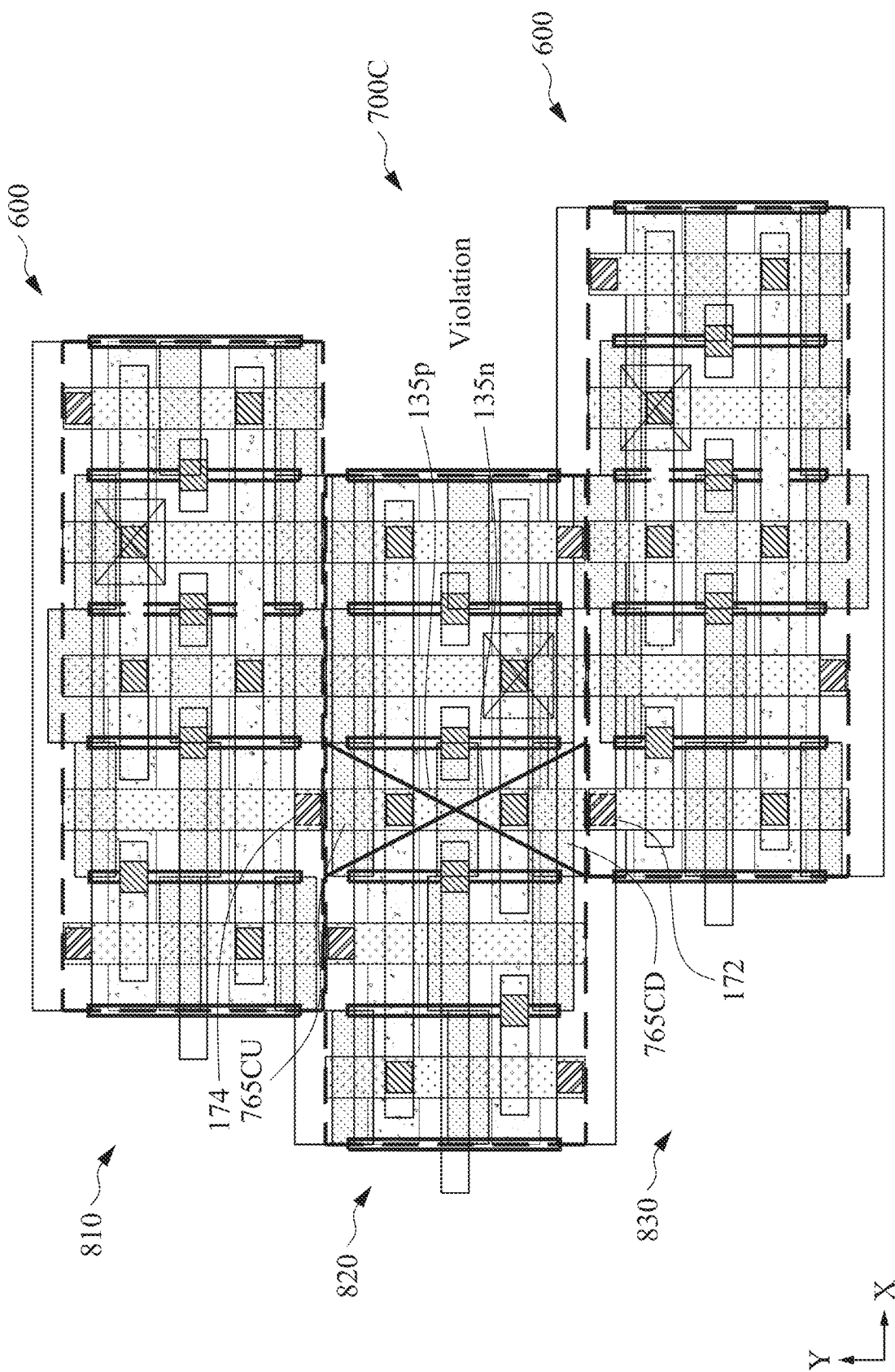

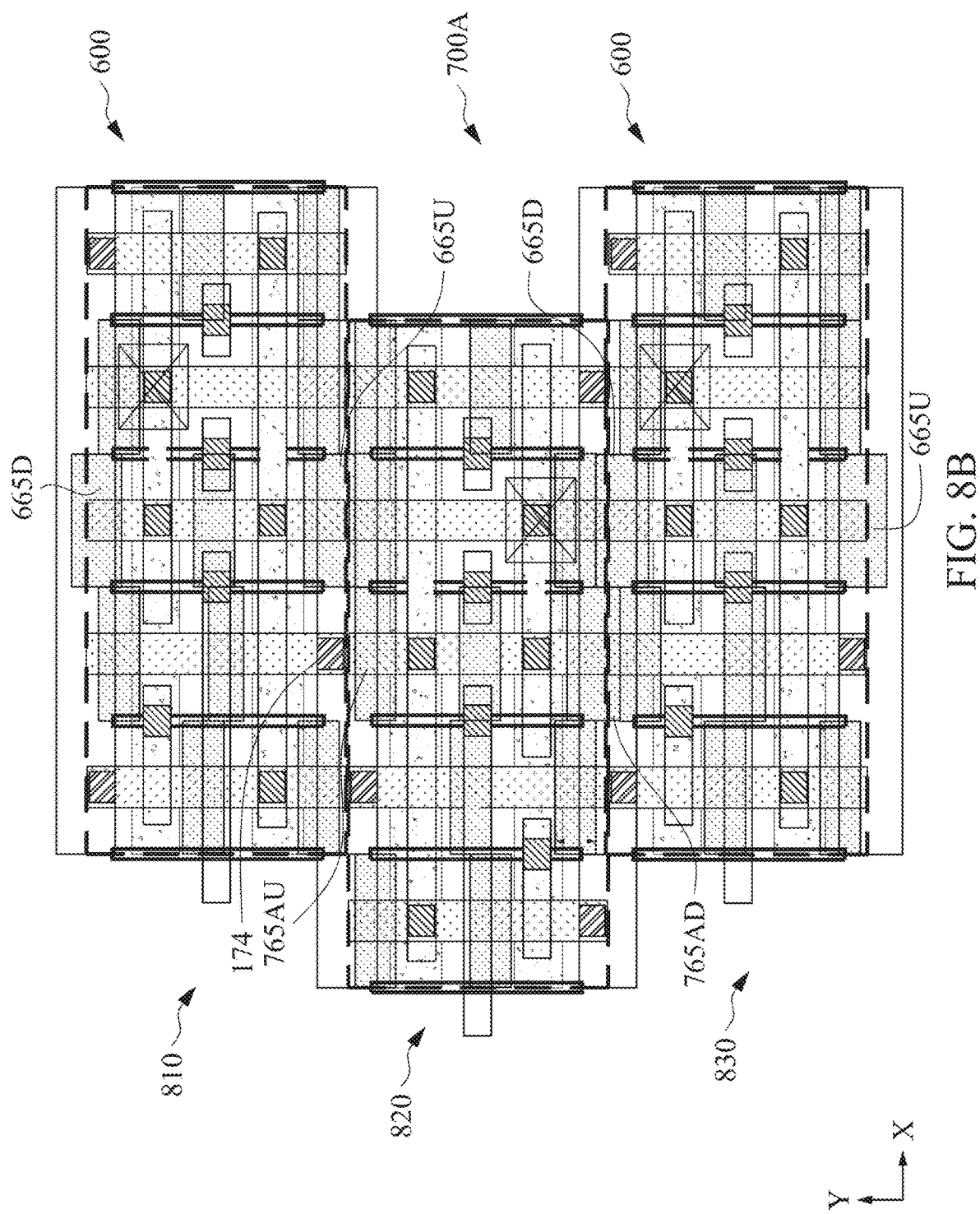

ARRANGEMENT OF SOURCE OR DRAIN CONDUCTORS OF TRANSISTOR

PRIORITY CLAIM AND CROSS-REFERENCE

The present application is a continuation of U.S. application Ser. No. 17/525,173, filed Nov. 12, 2021 and issued as U.S. Pat. No. 11,853,670, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8C are layout diagrams of integrated circuits having three AOI cells, in accordance with some embodiments.

DETAILED DESCRIPTION

Figure 1A:
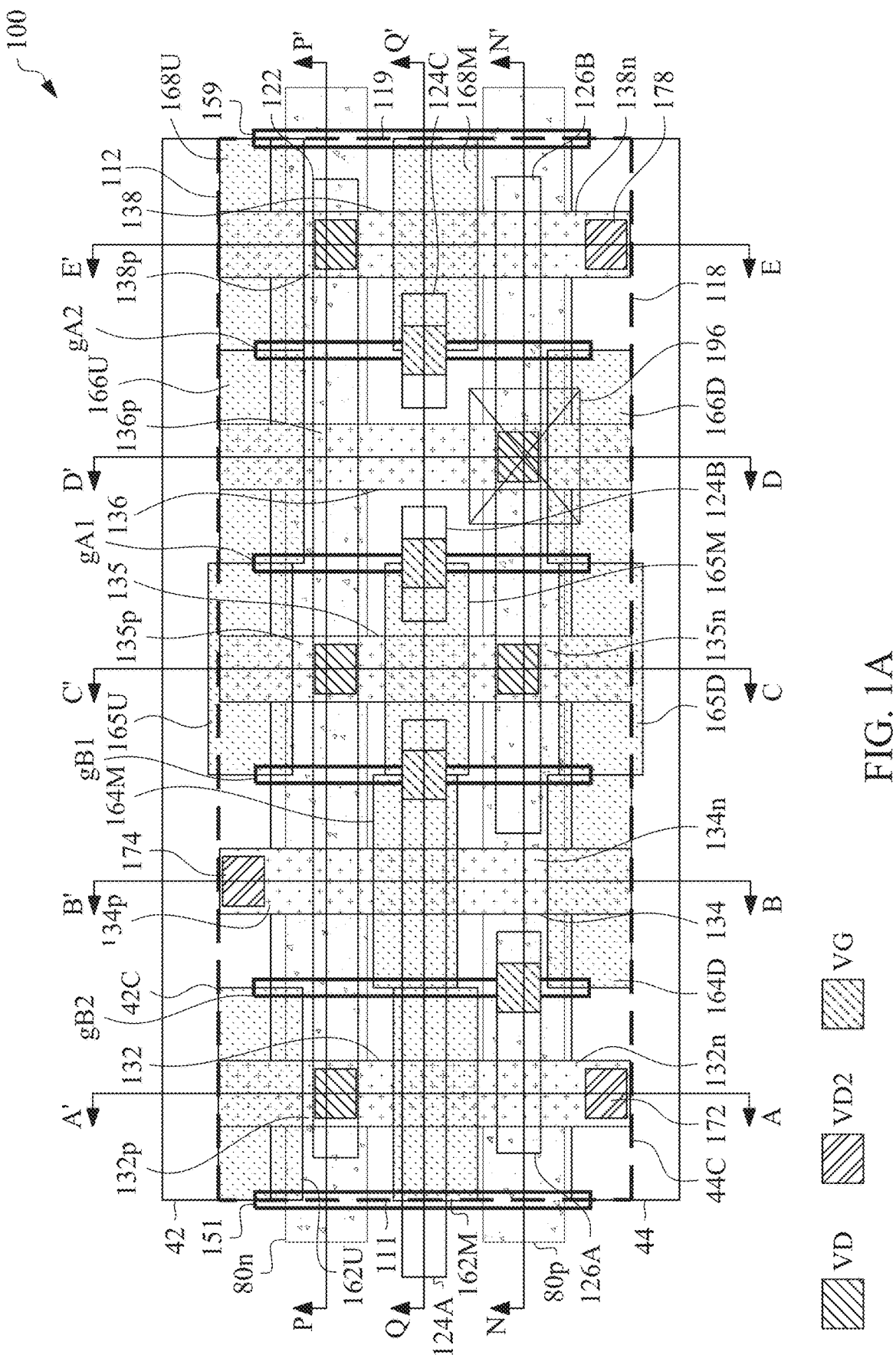
FIGS. 1A-1B are layout diagrams of an And-Or-Inverter cell ("AOI cell"), in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated circuit includes a first power rail configured to receive a first supply voltage (e.g., VDD) and a second power rail configured to receive a second supply voltage (e.g., VSS). The integrated circuit also includes a first conductor segment intersecting a first active-region structure at a source/drain region of a first type transistor (e.g., PMOS) and a second conductor segment intersecting a second active-region structure at a source/drain region of a second type transistor (e.g., NMOS). The first conductor segment and the second conductor segment are formed by removing an exposed portion of a terminal-conductor by etching processes. The exposed portion of the terminal-conductor is within a mask opening as defined by the terminal-conductor cutting pattern in a layout design. The edge of the first conductor segment which is closest to the second conductor segment and the edge of the second conductor segment which is closest to the first conductor segment are referred to as the proximal edges of the first conductor segment and the second conductor segment. The first conductor segment and the second conductor segment are separated at proximal edges by a separation distance which is defined by a height of the mask opening.

A first distance from the proximal edge of the first conductor segment to the centerline of the first power rail is different from a second distance from the proximal edge of the second conductor segment to the centerline of the second power rail. In some embodiments, when the first distance is different from the second distance by a predetermined distance that is a fraction of the separation distance between the two proximal edges, the lengths of one or more conductor segments are reduced, as compared with alternative designs in which the first distance is equal to the second distance. In some embodiments, reducing the lengths of one or more conductor segments results in smaller stray capacitive couplings and/or smaller RC delays. In some embodiments, reducing the lengths of one or more conductor segments results in a smaller height of the circuit cell having the two conductor segments as specified.

Figure 1B:
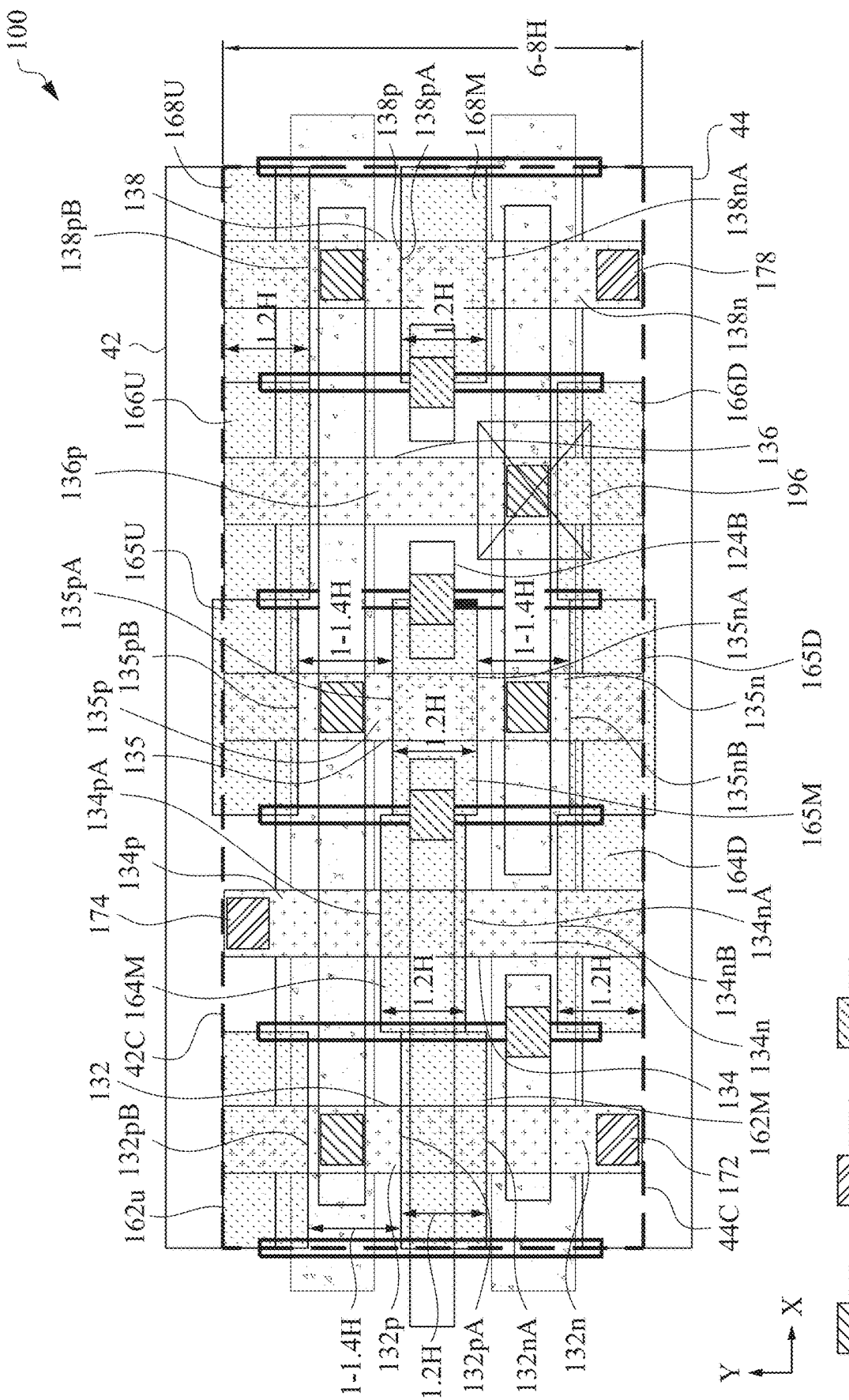

FIGS. 1A-1B are layout diagrams of an And-Or-Inverter cell 100 ("AOI cell 100"), in accordance with some embodiments. The layout diagram of FIG. 1A includes the layout patterns extending in the Y-direction for specifying gate-conductors (gB2, gB1, gA1, and gA2), dummy gate-conductors (151 and 159), and terminal-conductor lines (132, 134, 135, 136, and 138). The layout diagram of FIG. 1A also includes the layout patterns extending in the X-direction for specifying active-region structures (80p and 80n), power rails (42 and 44), and horizontal conducting lines (122, 124A, 124B, 124C, 126A, and 126B).

The AOI cell 100 is in a cell that is bounded by cell boundaries. The cell width along the X-direction is bounded by two vertical cell boundaries 111 and 119 extending in the Y-direction, and the cell height along the Y-direction is bounded by two horizontal cell boundaries 112 and 118 extending in the X-direction. In some embodiments, the vertical cell boundaries 111 and 119 are correspondingly aligned with the dummy gate-conductors 151 and 159, while the horizontal cell boundaries 112 and 118 are correspondingly aligned with the centerline 42C of the power rail 42 and the centerline 44C of the power rail 44.

In FIGS. 1A-1B, the layout patterns for specifying the terminal-conductor lines are intercepted by one or more of the layout patterns for specifying the cutting of the terminal-conductor lines ("terminal-conductor line cutting patterns"). The combinations of the terminal-conductor line cutting patterns (162U, 162M, 164M, 164D, 165U, 165M, 165D, 166U, 166D, 168U, and 168M) and the layout patterns for specifying the terminal-conductor lines (132, 134, 135, 136, and 138) provide the specifications for conductor segments of the corresponding terminal-conductor lines. The conductor segments specified by the layout pattern combinations in FIGS. 1A-1B include conductor segments 132p, 132n, 134p, 134n, 135p, 135n, 136p, 138p, and 138n. In some embodiments, each of the conductor segments is referred to as an MD conductor. In some embodiments, MD conductors are fabricated in a metal over diffusion layer, and an MD conductor for connecting with a planar transistor generally includes a metal conductor that forms an ohmic contact with a source diffusion region or a drain diffusion region of the planar transistor. In some embodiments, an MD conductor for connecting with a FinFET generally includes a metal conductor that forms an ohmic contact with a source epitaxial region or a drain epitaxial region of the FinFET. The combinations of the layout patterns for specifying the conductor segments are depicted in more detail in FIG. 1B.

In FIG. 1B, the layout pattern for the terminal-conductor line 132 is intercepted by the terminal-conductor line cutting patterns 162U and 162M which specifies that the terminal-conductor line 132 is separated into conductor segments 132p and 132n. The proximal edge 132pA of the conductor segment 132p and the proximal edge 132nA of the conductor segment 132n are defined by two horizontal edges of the terminal-conductor line cutting pattern 162M. The distal edge 132pB of the conductor segment 132p is defined by a horizontal edge of the terminal-conductor line cutting pattern 162U.

In FIG. 1B, the layout pattern for the terminal-conductor line 134 is intercepted by the terminal-conductor line cutting patterns 164M and 164D which specifies that the terminal-conductor line 134 is separated into conductor segments 134p and 134n. The proximal edge 134pA of the conductor segment 134p and the proximal edge 134nA of the conductor segment 134n are defined by two horizontal edges of the terminal-conductor line cutting pattern 164M. The distal edge 134nB of the conductor segment 134n is defined by a horizontal edge of the terminal-conductor line cutting pattern 164D.

In FIG. 1B, the layout pattern for the terminal-conductor line 135 is intercepted by the terminal-conductor line cutting patterns 165U, 165M, and 165D which specifies that the terminal-conductor line 135 is separated into conductor segments 135p and 135n. The proximal edge 135pA of the conductor segment 135p and the proximal edge 135nA of the conductor segment 135n are defined by two horizontal edges of the terminal-conductor line cutting pattern 165M. The distal edge 135pB of the conductor segment 135p is defined by a horizontal edge of the terminal-conductor line cutting pattern 165U. The distal edge 135nB of the conductor segment 135n is defined by a horizontal edge of the terminal-conductor line cutting pattern 165D.

In FIG. 1B, the layout pattern for the terminal-conductor line 136 is intercepted by the terminal-conductor line cutting patterns 166U and 166D which specifies that the terminal-conductor line 136 is cut at both ends and shortened into a conductor segment 136p. A first edge of the conductor segment 136p is defined by a horizontal edge of the terminal-conductor line cutting pattern 166U. A second edge of the conductor segment 136p is defined by a horizontal edge of the terminal-conductor line cutting pattern 166D.

In FIG. 1B, the layout pattern for the terminal-conductor line 138 is intercepted by the terminal-conductor line cutting patterns 168U and 168M which specifies that the terminal-conductor line 138 is separated into conductor segments 138p and 138n. The proximal edge 138pA of the conductor segment 138p and the proximal edge 138nA of the conductor segment 138n are defined by two horizontal edges of the terminal-conductor line cutting pattern 168M. The distal edge 138pB of the conductor segment 138p is defined by a horizontal edge of the terminal-conductor line cutting pattern 168U.

Figure 1C:
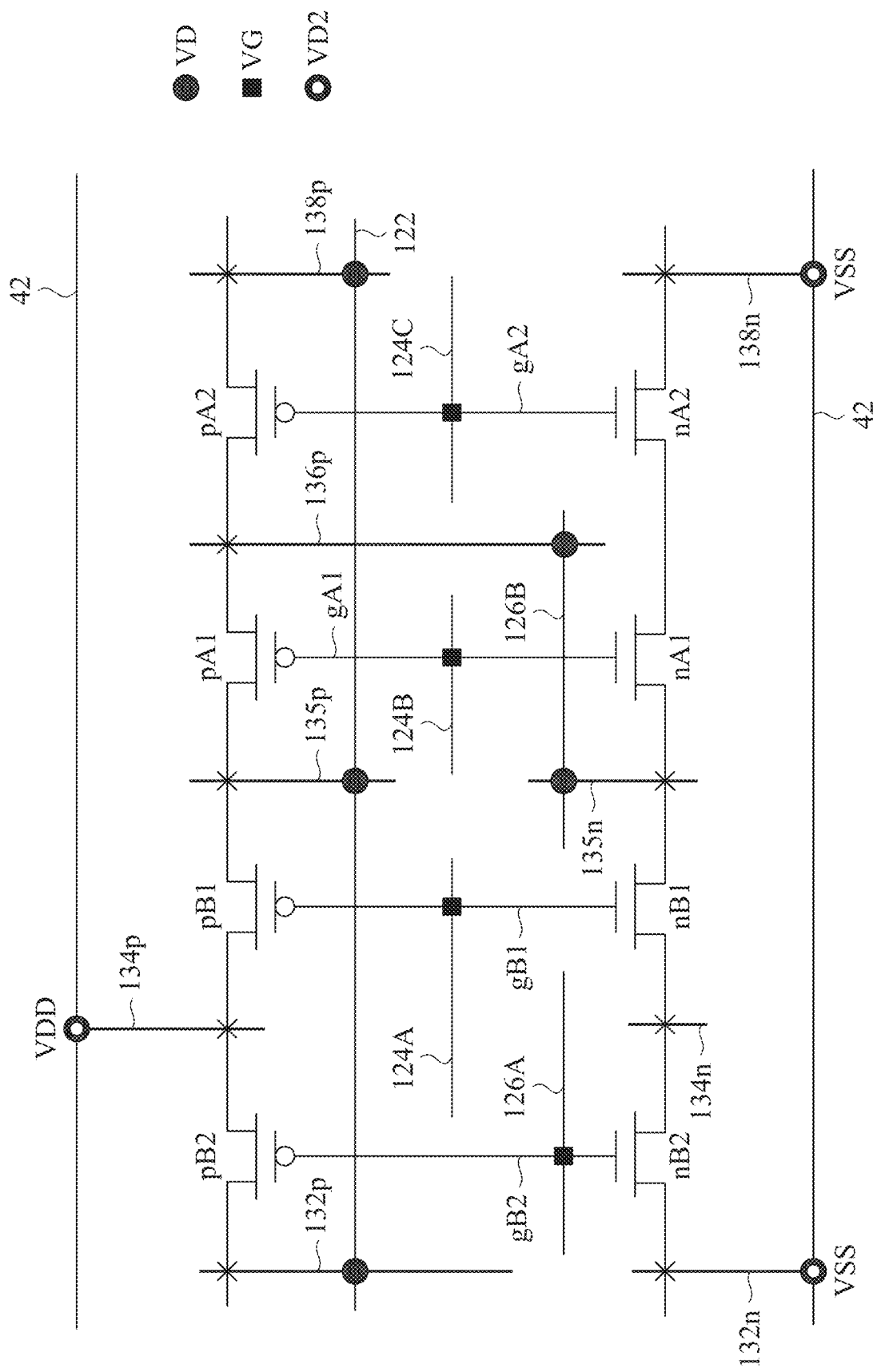
FIG. 1C is an equivalent circuit of the AOI cell as specified by the layout diagrams in FIGS. 1A-1B, in accordance with some embodiments.

FIG. 1C is an equivalent circuit of the AOI cell 100 as specified by the layout diagrams in FIGS. 1A-1B, in accordance with some embodiments. FIGS. 2A-2C and FIGS. 3A-3E are cross-sectional views of the AOI cell 100 as specified by the layout diagrams in FIGS. 1A-1B, in accordance with some embodiments.

In the AOI cell 100 as specified by the layout diagram of FIG. 1A and as shown in the equivalent circuit of FIG. 1C, each of the gate-conductors gB2, gB1, gA1, and gA2 intersects the active-region structure 80p at the channel regions of the p-type transistors pB2, pB1, pA1, and pA2, thereby forming the gate terminal for the corresponding p-type transistor. Each of the gate-conductors gB2, gB1, gA1, and gA2 intersects the active-region structure 80n at the channel regions of the n-type transistors nB2, nB1, nA1, and nA2, thereby forming the gate terminal for the corresponding n-type transistor. The conductor segments 132p, 134p, 135p, 136p, and 138p intersect the active-region structure 80p at various source/drain regions of the p-type transistors pB2, pB1, pA1, and pA2, thereby forming the corresponding source/drain terminals for the p-type transistors. The conductor segments 132n, 134n, 135n, and 138n intersect the active-region structure 80n at various source/drain regions of the n-type transistors nB2, nB1, nA1, and nA2, thereby forming the corresponding source/drain terminals of the n-type transistors. In FIG. 1A, at the intersection of the active-region structure 80n and the conductor segment 136p, the float terminal-conductor layout pattern 196 specifies that the conductor segment 136p does not directly form conductive contact with the source/drain regions in the active-region structure 80n. In some embodiments, the float terminal-conductor pattern is referred to as a fly MD layout pattern or flyMD pattern.

In some embodiments, when the active-region structures 80p and 80n are formed with fin structures, the p-type transistors (pB2, pB1, pA1, and pA2) and the n-type transistors (nB2, nB1, nA1, and nA2) are FinFETs. In some embodiments, when the active-region structures 80p and 80n are formed with nano-sheet structures, the p-type transistors (pB2, pB1, pA1, and pA2) and the n-type transistors (nB2, nB1, nA1, and nA2) are nano-sheet transistors. In some embodiments, when the active-region structures 80p and 80n are formed with nano-wire structures, the p-type transistors (pB2, pB1, pA1, and pA2) and the n-type transistors (nB2, nB1, nA1, and nA2) are nano-wire transistors.

In FIG. 1A, the layout patterns for the dummy gate-conductors 151 and 159 at the vertical cell boundaries of the AOI cell 100 specify that the active regions (such as, source regions, drain regions, and channel regions) in the AOI cell 100 are isolated from the active regions in adjacent cells.

In the AOI cell 100 as specified by the layout diagram of FIG. 1A and as shown in the equivalent circuit of FIG. 1C, the horizontal conducting lines (122, 124A, 124B, 124C, 126A, and 126B) and the power rails (42 and 44) are positioned in a first metal layer M0. The conductor segment 134p is conductively connected to the power rail 42 through a via-connector VD2 which is configured for providing a first supply voltage VDD. Each of the conductor segments 132n and 138n is conductively connected to the power rail 44 through a via-connector VD2 which is configured for providing a second supply voltage VSS. Each of the horizontal conducting lines 126A, 124A, 124B, and 124C is correspondingly connected to one of the gate-conductors gB2, gB1, gA1, and gA2 through a gate via-connector VG. The horizontal conducting line 126B is conductively connected to each of the conductor segments 136p and 135n through a via-connector VD. The horizontal conducting line 122 is conductively connected to each of the conductor segments 132p, 135p, and 138p through a via-connector VD.

Each of the horizontal conducting lines 124A, 124B, 124C, 126A, and 126B functions as a pin connector. The horizontal conducting lines 126A, 124A, 124B, and 124C are the pin connectors correspondingly for the input signals "B2", "B1", "A1", and "A2" of the AOI cell 100. The horizontal conducting line 126B is the pin connector for the output signal "ZN" of the AOI cell 100.

Figure 2A:
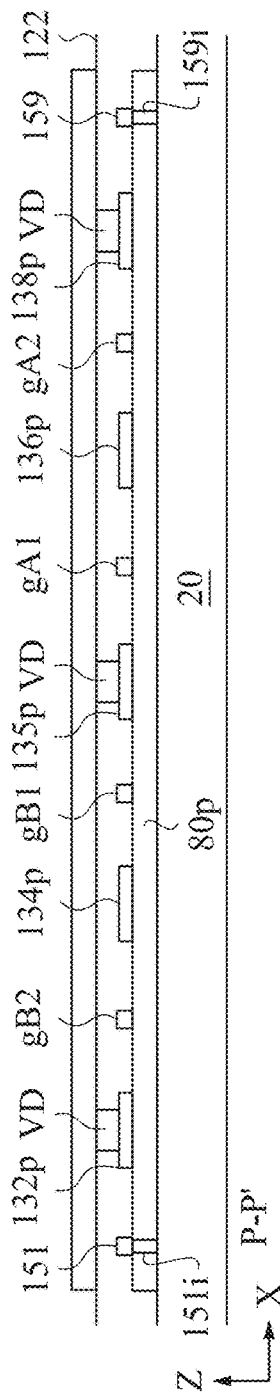
FIGS. 2A-2C are cross-sectional view of the AOI cell as specified by FIGS. 1A-1B, in accordance with some embodiments.

FIG. 2A is a cross-sectional view of the AOI cell 100 as specified by FIGS. 1A-1B in a cutting plane P-P', in accordance with some embodiments. As shown in FIG. 2A, the active-region structure 80p is on the substrate 20. Each of the gate-conductors gB2, gB1, gA1, and gA2 intersects the active-region structure 80p at one of the channel regions of the p-type transistors pB2, pB1, pA1, and pA2. Each of the conductor segments 132p, 134p, 135p, 136p, and 138p intersects the active-region structure 80p at one of the source/drain regions of the p-type transistors pB2, pB1, pA1, and pA2. In some embodiments, the active regions (such as, the source region, the channel region, or the drain region) in the active-region structure 80p are isolated from the active regions in the adjacent cells by the boundary isolation region 151i under the dummy gate-conductor 151 and the boundary isolation region 159i under the dummy gate-conductor 159. The horizontal conducting line 122 is conductively connected to each of the conductor segments 132p, 135p, and 138p through a corresponding via-connector VD.

Figure 2B:
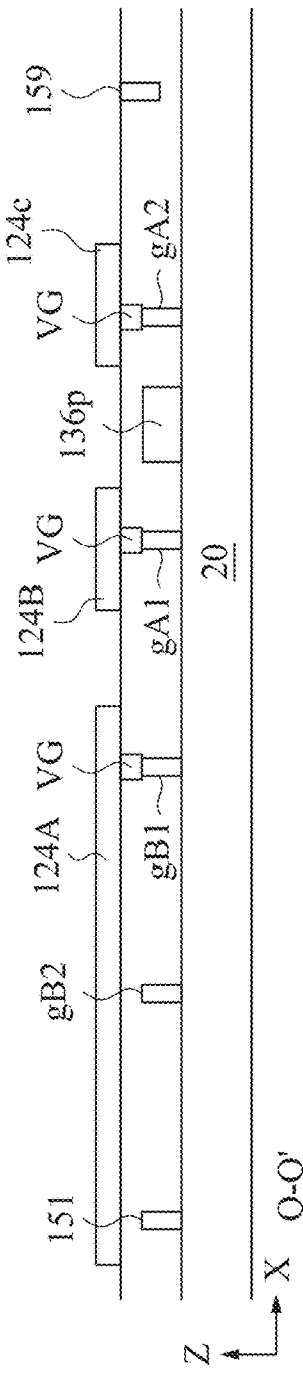

FIG. 2B is a cross-sectional view of the AOI cell 100 as specified by FIGS. 1A-1B in a cutting plane Q-Q', in accordance with some embodiments. In FIG. 2B, the gate-conductors gB2, gB1, gA1, and gA2, the dummy gate-conductors 151 and 159, and the conductor segment 136p are all on the substrate 20. The horizontal conducting lines 124A, 124B, and 124C are correspondingly connected to the gate-conductors gB1, gA1, and gA2 through a via-connector VG.

Figure 2C:
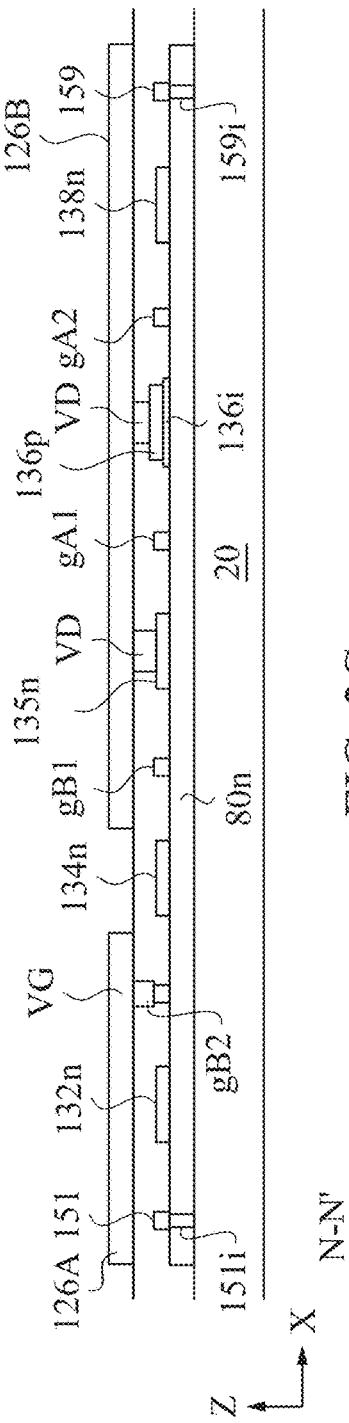

FIG. 2C is a cross-sectional view of the AOI cell 100 as specified by FIGS. 1A-1B in a cutting plane N-N', in accordance with some embodiments. As shown in FIG. 2C, the active-region structure 80n is on the substrate 20. Each of the gate-conductors gB2, gB1, gA1, and gA2 intersects the active-region structure 80n at one of the channel regions of the n-type transistors nB2, nB1, nA1, and nA2. Each of the conductor segments 132n, 134n, 135n, and 138n intersects the active-region structure 80n at one of the source/drain regions of the n-type transistors nB2, nB1, nA1, and nA2. The conductor segment 136p, however, does not make direct conductive contact with the source/drain regions of the n-type transistors nA1 or nA2 in the active-region structure 80n, because the insulation structure 136i is deposited between the conductor segment 136p and the active-region structure 80n. The insulation structure 136i is a specific implementation of the required insulation as specified by the float terminal-conductor layout pattern 196 in FIG. 1A. In the embodiments as shown in FIG. 2C, the active regions (such as, the source region, the channel region, or the drain region) in the active-region structure 80n are also isolated from the active regions in the adjacent cells by the boundary isolation region 151i under the dummy gate-conductor 151 and the boundary isolation region 159i under the dummy gate-conductor 159. The horizontal conducting line 126A is conductively connected to the gate-conductor gB2 through a via-connector VG. The horizontal conducting line 126B is conductively connected to each of the conductor segments 135n and 136p through a corresponding via-connector VD.

Figure 3A:
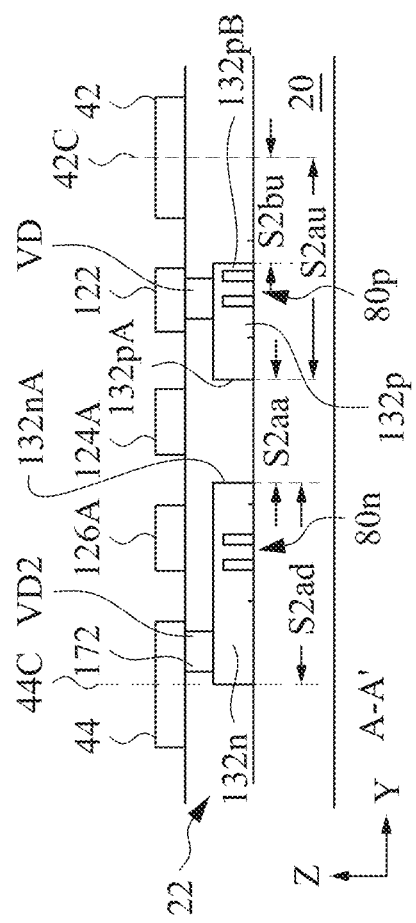
FIGS. 3A-3E are cross-sectional views of the AOI cell as specified by FIGS. 1A-1B, in accordance with some embodiments.

FIG. 3A is a cross-sectional view of the AOI cell 100 as specified by FIGS. 1A-1B in a cutting plane A-A', in accordance with some embodiments. In FIG. 3A, the conductor segment 132p intersects the active-region structure 80p on the substrate 20, and the conductor segment 132n intersects the active-region structure 80n on the substrate 20. The insulation layer 22 covers the conductor segments 132n and 132p. The power rails (42 and 44) and the horizontal conducting lines 122, 124A, and 126A are in the first metal layer overlying the insulation layer 22. The horizontal conducting line 122 is connected to the conductor segment 132p through a via-connector VD that passes through the insulation layer 22. The power rail 44 is connected to the conductor segment 132n through a via-connector VD2 (identified as a via-connector 172) that passes through the insulation layer 22. The proximal edge 132pA of the conductor segment 132p and the proximal edge 132nA of the conductor segment 132n are separated by a separation distance S2aa along the Y-direction. A vertical distance S2au along the Y-direction from a centerline 42C of the power rail 42 to the proximal edge 132pA of the conductor segment 132p is larger than a vertical distance S2ad along the Y-direction from a centerline 44C of the power rail 44 to the proximal edge 132nA of the conductor segment 132n. A vertical distance S2bu along the Y-direction from the centerline 42C of the power rail 42 to the distal edge 132pB of the conductor segment 132*p* is equal to the separation distance S2*aa* between the proximal edges of the conductor segments 132*p* and 132*n*.

Figure 3B:
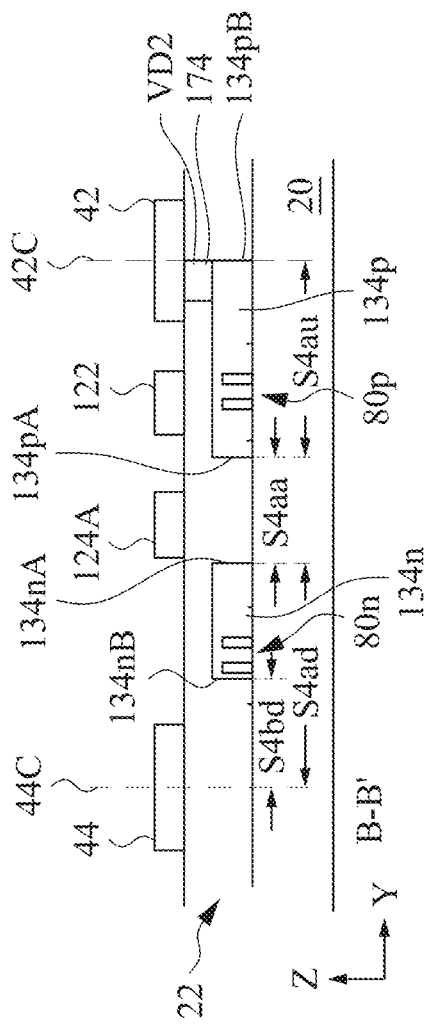

FIG. 3B is a cross-sectional view of the AOI cell 100 as specified by FIGS. 1A-1B in a cutting plane B-B', in accordance with some embodiments. In FIG. 3B, the conductor segment 134*p* intersects the active-region structure 80*p* on the substrate 20, and the conductor segment 134*n* intersects the active-region structure 80*n* on the substrate 20. The insulation layer 22 covers the conductor segments 134*n* and 134*p*. The power rails (42 and 44) and the horizontal conducting lines 122 and 124A are in the first metal layer overlying the insulation layer 22. The power rail 42 is connected to the conductor segment 134*p* through a via-connector VD2 (identified as a via-connector 174) that passes through the insulation layer 22. The proximal edge 134*p*A of the conductor segment 134*p* and the proximal edge 134*n*A of the conductor segment 134*n* are separated by a separation distance S4*aa* along the Y-direction. A vertical distance S4*au* along the Y-direction from a centerline 42C of the power rail 42 to the proximal edge 134*p*A of the conductor segment 134*p* is smaller than a vertical distance S4*ad* along the Y-direction from a centerline 44C of the power rail 44 to the proximal edge 134*n*A of the conductor segment 134*n*. A vertical distance S4*bd* along the Y-direction from the centerline 44C of the power rail 44 to the distal edge 134*n*B of the conductor segment 134*n* is equal to the separation distance S4*aa* between the proximal edges of the conductor segments 134*p* and 134*n*.

Figure 3C:
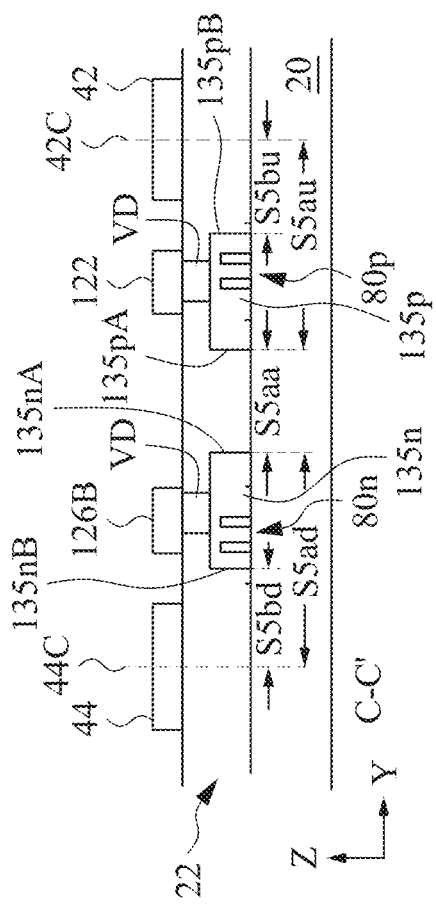

FIG. 3C is a cross-sectional view of the AOI cell 100 as specified by FIGS. 1A-1B in a cutting plane C-C', in accordance with some embodiments. In FIG. 3C, the conductor segment 135*p* intersects the active-region structure 80*p* on the substrate 20, and the conductor segment 135*n* intersects the active-region structure 80*n* on the substrate 20. The insulation layer 22 covers the conductor segments 135*n* and 135*p*. The power rails (42 and 44) and the horizontal conducting lines 122 and 126B are in the first metal layer overlying the insulation layer 22. The horizontal conducting line 122 is connected to the conductor segment 135*p* through a via-connector VD above the conductor segment 135*p*, and the horizontal conducting line 126B is connected to the conductor segment 135*n* through a via-connector VD above the conductor segment 135*n*. The proximal edge 135*p*A of the conductor segment 135*p* and the proximal edge 135*n*A of the conductor segment 135*n* are separated by a separation distance S5*aa* along the Y-direction. A vertical distance S5*au* along the Y-direction from a centerline 42C of the power rail 42 to the proximal edge 135*p*A of the conductor segment 135*p* is equal to a vertical distance S5*ad* along the Y-direction from a centerline 44C of the power rail 44 to the proximal edge 135*n*A of the conductor segment 135*n*. A vertical distance S5*bu* along the Y-direction from the centerline 42C of the power rail 42 to the distal edge 135*p*B of the conductor segment 135*p* is equal to the separation distance S5*aa* between the proximal edges of the conductor segments 135*p* and 135*n*. A vertical distance S5*bd* along the Y-direction from the centerline 44C of the power rail 44 to the distal edge 135*n*B of the conductor segment 135*n* is also equal to the separation distance S5*aa*.

Figure 3D:
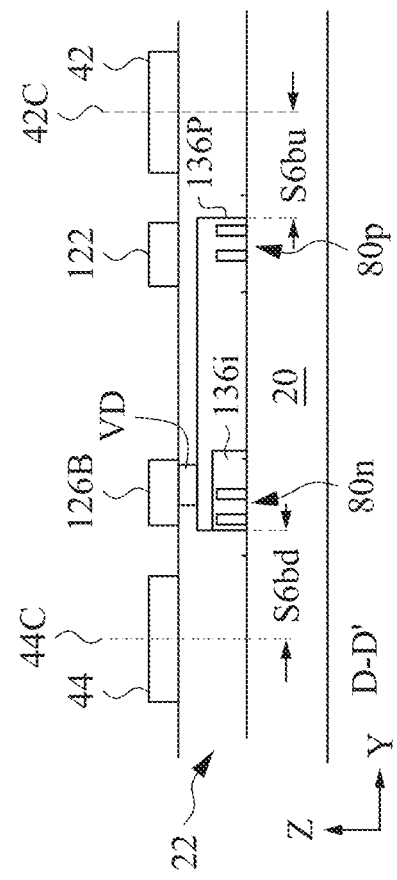

FIG. 3D is a cross-sectional view of the AOI cell 100 as specified by FIGS. 1A-1B in a cutting plane D-D', in accordance with some embodiments. In FIG. 3D, the conductor segment 136*p* intersects the active-region structure 80*p* on the substrate 20. Even though the conductor segment 136*p* extends over the active-region structure 80*n*, the conductor segment 136*p* still does not directly form conductive contact with the source/drain regions in the active-region structure 80*n*, because of the insulation structure 136*i* between the conductor segment 136*p* and the active-region structure 80*n*. The power rails (42 and 44) and the horizontal conducting lines 122 and 126B are in the first metal layer overlying the insulation layer 22. The horizontal conducting line 126B is connected to the conductor segment 136*p* through a via-connector VD. The vertical distance S6*bu* is the distance along the Y-direction from the centerline 42C of the power rail 42 to a first edge of the conductor segment 136*p*, and the vertical distance S6*bd* is the distance along the Y-direction from the centerline 44C of the power rail 44 to a second edge of the conductor segment 136*p*.

Figure 3E:
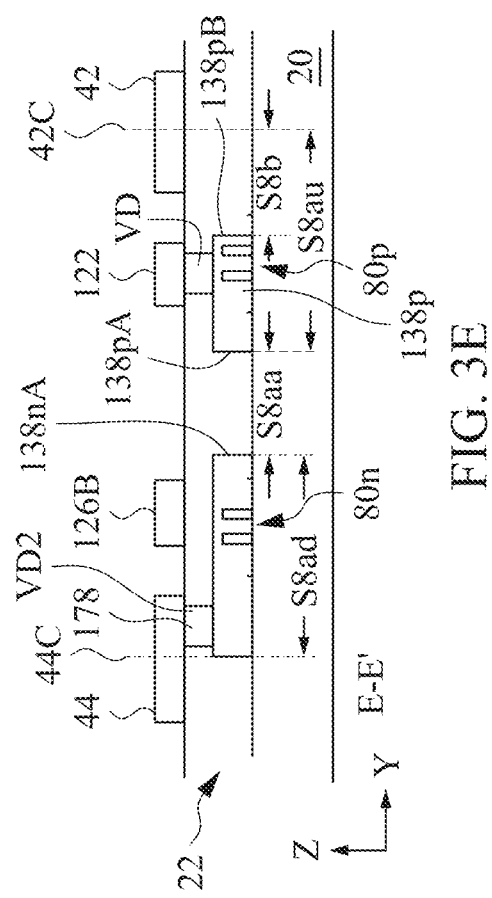

FIG. 3E is a cross-sectional view of the AOI cell 100 as specified by FIGS. 1A-1B in a cutting plane E-E', in accordance with some embodiments. In FIG. 3E, the conductor segment 138*p* intersects the active-region structure 80*p* on the substrate 20, and the conductor segment 138*n* intersects the active-region structure 80*n* on the substrate 20. The insulation layer 22 covers the conductor segments 138*n* and 138*p*. The power rails (42 and 44) and the horizontal conducting lines 122 and 126B are in the first metal layer overlying the insulation layer 22. The horizontal conducting line 122 is connected to the conductor segment 138*p* through a via-connector VD that passes through the insulation layer 22. The power rail 44 is connected to the conductor segment 138*n* through a via-connector VD2 (identified as a via-connector 178) that passes through the insulation layer 22. The proximal edge 138*p*A of the conductor segment 138*p* and the proximal edge 138*n*A of the conductor segment 138*n* are separated by a separation distance S8*aa* along the Y-direction. A vertical distance S8*au* along the Y-direction from a centerline 42C of the power rail 42 to the proximal edge 138*p*A of the conductor segment 138*p* is larger than a vertical distance S8*ad* along the Y-direction from a centerline 44C of the power rail 44 to the proximal edge 138*n*A of the conductor segment 138*n*. A vertical distance S8*bu* along the Y-direction from the centerline 42C of the power rail 42 to the distal edge 138*p*B of the conductor segment 138*p* is equal to the separation distance S8*aa* between the proximal edges of the conductor segments 138*p* and 138*n*.

In FIGS. 3A-3E, the separation distances S2*aa*, S4*aa*, S5*aa*, and S8*aa* between the proximal edges of two conductor segments are determined by the height (along the Y-direction) of the corresponding terminal-conductor line cutting patterns 162M, 164M, 165M, or 168M as shown in FIG. 1B. The height of each of the terminal-conductor line cutting patterns 162M, 164M, 165M, and 168M as shown in FIG. 1B is 1.2 times the basic height unit H (i.e., 1.2H). In some embodiments, it is not necessary that the heights of the terminal-conductor line cutting patterns are all exactly the same 1.2H, but the heights of the terminal-conductor line cutting patterns 162M, 164M, 165M, and 168M are in a range from 1.15H to 1.25H. Consequently, each of the separation distances S2*aa*, S4*aa*, S5*aa*, and S8*aa* in a range from 1.15H to 1.25H. In some embodiments, the heights of the terminal-conductor line cutting patterns are more than 1.2H. In some embodiments, the height of each terminal-conductor line cutting pattern is selected to be as large as possible without violating the design rules. In some embodiments, the larger the height of each terminal-conductor line cutting pattern, the shorter the lengths for most of the conductor segments, and the reduced lengths of conductor segments results in smaller stray capacitive couplings and/or smaller RC delays, which improves the speed performance of the integrated circuits.

In FIG. 1B, the terminal-conductor line cutting pattern 165M is positioned along the Y-direction at the middle position between the centerline 42C of the power rail 42 and the centerline 44C of the power rail 44. Consequently, as shown in FIG. 3C, the vertical distance S5au along the Y-direction from the centerline 42C to the proximal edge 135pA of the conductor segment 135p is equal to the vertical distance S5ad along the Y-direction from the centerline 44C to the proximal edge 135nA of the conductor segment 135n. In FIG. 1B, while each of the terminal-conductor line cutting patterns 165U and 165D has a height that is 1.2H, the position of the terminal-conductor line cutting pattern 165U is adjusted along the Y-direction to keep the length of the conductor segment 135p in a range from 1.0H to 1.4H, and the position of the terminal-conductor line cutting pattern 165D is adjusted along the Y-direction to keep the length of the conductor segment 135n also in a range from 1.0H to 1.4H. In some embodiments, the length of at least one of the two conductor segments (135p and 135n) is implemented with a value that is below 1.0H or above 1.4H. In some embodiments, the length of one of the two conductor segments (135p and 135n) is implemented with a value that is as small as possible without violating the design rules. In some embodiments, the length of one of the two conductor segments (135p and 135n) is implemented with a value that is as large as possible without violating the design rules. In some embodiments, shortening the length of the conductor segments results in smaller stray capacitive couplings and/or smaller RC delays, which improves the speed performance of the integrated circuits. As shown in FIGS. 1B and 1n FIG. 3C, the length of the conductor segment 135p is measured from the proximal edge 135pA to the distal edge 135pB of the conductor segment 135p, and the length of the conductor segment 135n is measured from the proximal edge 135nA to the distal edge 135nB of the conductor segment 135n.

In FIG. 3A, the vertical distance S2bu along the Y-direction from the centerline 42C of the power rail 42 to the distal edge 132pB of the conductor segment 132p is determined by the height (along the Y-direction) of the terminal-conductor line cutting pattern 162U in FIG. 1B. When the height of the terminal-conductor line cutting pattern 162U is equal to the height of the terminal-conductor line cutting pattern 162M, the vertical distance S2bu is equal to the separation distances S2aa between the proximal edges of conductor segments 132p and 132n. In FIG. 1B, the position of the terminal-conductor line cutting pattern 162M along the Y-direction is shifted downwards from the middle position between the centerline 42C of the power rail 42 and the centerline 44C of the power rail 44. If the position of the terminal-conductor line cutting pattern 162M is shifted downwards from the middle position by a vertical distance that is equal to Δ, then the vertical distance S2au from the centerline 42C to the proximal edge 132pA of the conductor segment 132p is larger than the vertical distance S2ad from the centerline 44C to the proximal edge 132nA of the conductor segment 132n by a vertical distance that is equal to 2Δ. In FIG. 1B, each of the terminal-conductor line cutting patterns 162U and 162M has a height that is 1.2H, and the position of the terminal-conductor line cutting pattern 162M is shifted downwards from the middle position, whereby the length of the conductor segment 132p is implemented in a range from 1.0H to 1.4H. In some embodiments, the position of the terminal-conductor line cutting pattern 162M is shifted downwards from the middle position by a vertical distance that is in a range from 0.1H to 0.2H. Correspondingly, the vertical distance S2au is larger than the vertical distance S2ad by a vertical distance equal that is in a range from 0.2H to 0.4H.

In some embodiments, the position of the terminal-conductor line cutting pattern 162M is shifted downwards from the middle position by a minimal amount to prevent design rule violations associated with any width increase of the terminal-conductor line cutting patterns 162U, while minimizing the length of the conductor segment 132p to reduce the associated stray capacitive coupling at the same time. In some embodiments, the position of the terminal-conductor line cutting pattern 162M is shifted downwards from the middle position as much as possible without causing design rule violations, while minimizing the length of the conductor segment 132n to reduce the associated stray capacitive coupling at the same time.

In FIG. 3B, the vertical distance S4bd along the Y-direction from the centerline 44C of the power rail 44 to the distal edge 134nB of the conductor segment 134n is determined by the height (along the Y-direction) of the terminal-conductor line cutting pattern 164D in FIG. 1B. When the height of the terminal-conductor line cutting pattern 164D is equal to the height of the terminal-conductor line cutting pattern 164M, the vertical distance S4bd is equal to the separation distances S4aa between the proximal edges of conductor segments 134p and 134n. In FIG. 1B, each of the terminal-conductor line cutting patterns 164D and 164M has a height that is 1.2H, and the position of the terminal-conductor line cutting pattern 165M along the Y-direction is shifted upwards from the middle position between the centerline 42C of the power rail 42 and the centerline 44C of the power rail 44, whereby the length of the conductor segment 134n is implemented in a range from 1.0H to 1.4H. In some embodiments, the position of the terminal-conductor line cutting pattern 164M is shifted upwards from the middle position by a vertical distance that is in a range from 0.1H to 0.2H. Correspondingly, the vertical distance S4au from the centerline 42C to the proximal edge 134pA of the conductor segment 134p is smaller than the vertical distance S4ad from the centerline 44C to the proximal edge 134nA of the conductor segment 134n by a vertical distance that is equal in a range from 0.2H to 0.4H.

In some embodiments, the position of the terminal-conductor line cutting pattern 164M is shifted upwards from the middle position by a minimal amount to prevent design rule violations associated with any width increase of the terminal-conductor line cutting patterns 164D, while minimizing the length of the conductor segment 134n to reduce the associated stray capacitive coupling at the same time. In some embodiments, the position of the terminal-conductor line cutting pattern 162M is shifted upwards from the middle position as much as possible without causing design rule violations, while minimizing the length of the conductor segment 134p to reduce the associated stray capacitive coupling at the same time.

In FIG. 3D, the vertical distance S6bu along the Y-direction from the centerline 42C of the power rail 42 to a first edge of the conductor segment 136p is determined by the height (along the Y-direction) of the terminal-conductor line cutting pattern 166U in FIG. 1B, and the vertical distance S6bd along the Y-direction from the centerline 44C of the power rail 44 to a second edge of the conductor segment 136p is determined by the height (along the Y-direction) of the terminal-conductor line cutting pattern 166D. When the height of the terminal-conductor line cutting pattern 166U is equal to the height of the terminal-conductor line cutting pattern 166D, the vertical distance S6*bu* is equal to the vertical distance S6*bd*.

In FIG. 3E, the vertical distance S8*bu* along the Y-direction from the centerline 42C of the power rail 42 to the distal edge 138*p*B of the conductor segment 138*p* is determined by the height (along the Y-direction) of the terminal-conductor line cutting pattern 168U in FIG. 1B. When the height of the terminal-conductor line cutting pattern 168U is equal to the height of the terminal-conductor line cutting pattern 168M, the vertical distance S8*bu* is equal to the separation distance S8*aa* between the proximal edges of conductor segments 138*p* and 138*n*. In FIG. 1B, each of the terminal-conductor line cutting patterns 168U and 168M has a height that is 1.2H, and the position of the terminal-conductor line cutting pattern 165M along the Y-direction is shifted downwards from the middle position between the centerline 42C of the power rail 42 and the centerline 44C of the power rail 44, whereby the length of the conductor segment 138*p* is implemented in a range from 1.0H to 1.4H. In some embodiments, the position of the terminal-conductor line cutting pattern 168M is shifted downwards from the middle position by a vertical distance that is in a range from 0.1H to 0.2H. Correspondingly, the vertical distance S8*au* from the centerline 42C to the proximal edge 138*p*A of the conductor segment 138*p* is larger than the vertical distance S8*ad* from the centerline 44C to the proximal edge 138*n*A of the conductor segment 138*n* by a vertical distance equal that is in a range from 0.2H to 0.4H.

In some embodiments, the position of the terminal-conductor line cutting pattern 168M is shifted downwards from the middle position by a minimal amount to prevent design rule violations associated with any width increase of the terminal-conductor line cutting patterns 168U, while minimizing the length of the conductor segment 138*p* to reduce the associated stray capacitive coupling at the same time. In some embodiments, the position of the terminal-conductor line cutting pattern 168M is shifted downwards from the middle position as much as possible without causing design rule violations, while minimizing the length of the conductor segment 138*n* to reduce the associated stray capacitive coupling at the same time.

In FIGS. 1A-1B, the cell height of the AOI cell 100 is in a range from 6.0H to 8.0H. In some embodiments, the layout design of the AOI cell 100 is supplemented with additional layout designs of AOI cells in FIGS. 4A-4C. In some embodiments, the basic height unit H is the minimal height of the terminal-conductor line cutting patterns in a circuit cell without causing design rule violations.

When the layout design of the AOI cell 100 in FIGS. 1A-1B is placed in a layout design as a circuit component in a larger circuit, none of the terminal-conductor line cutting pattern 165U (for defining the distal edge 135*p*B of the conductor segment 135*p*) and the terminal-conductor line cutting pattern 165D (for defining the distal edge 135*n*B of the conductor segment 135*n*) is adjacent to a via-connector VD2 in a neighboring cell. On the other hand, when the terminal-conductor line cutting pattern for defining the distal edge 135*p*B of the conductor segment 135*p* is adjacent to a via-connector 412 in a first neighboring cell and the terminal-conductor line cutting pattern for defining the distal edge 135*n*B of the conductor segment 135*n* is adjacent to a via-connector 414 in a second neighboring cell, the layout design of the AOI cell 400C in FIG. 4C is used as a circuit component in a larger circuit. In FIG. 4C, the via-connector 412 is a via-connector VD2 that connects the power rail 42 to a conductor segment (not shown in the figure) in the first neighboring cell, and the via-connector 414 is a via-connector VD2 that connects the power rail 44 to a conductor segment (not shown in the figure) in the second neighboring cell.

Figure 4A:
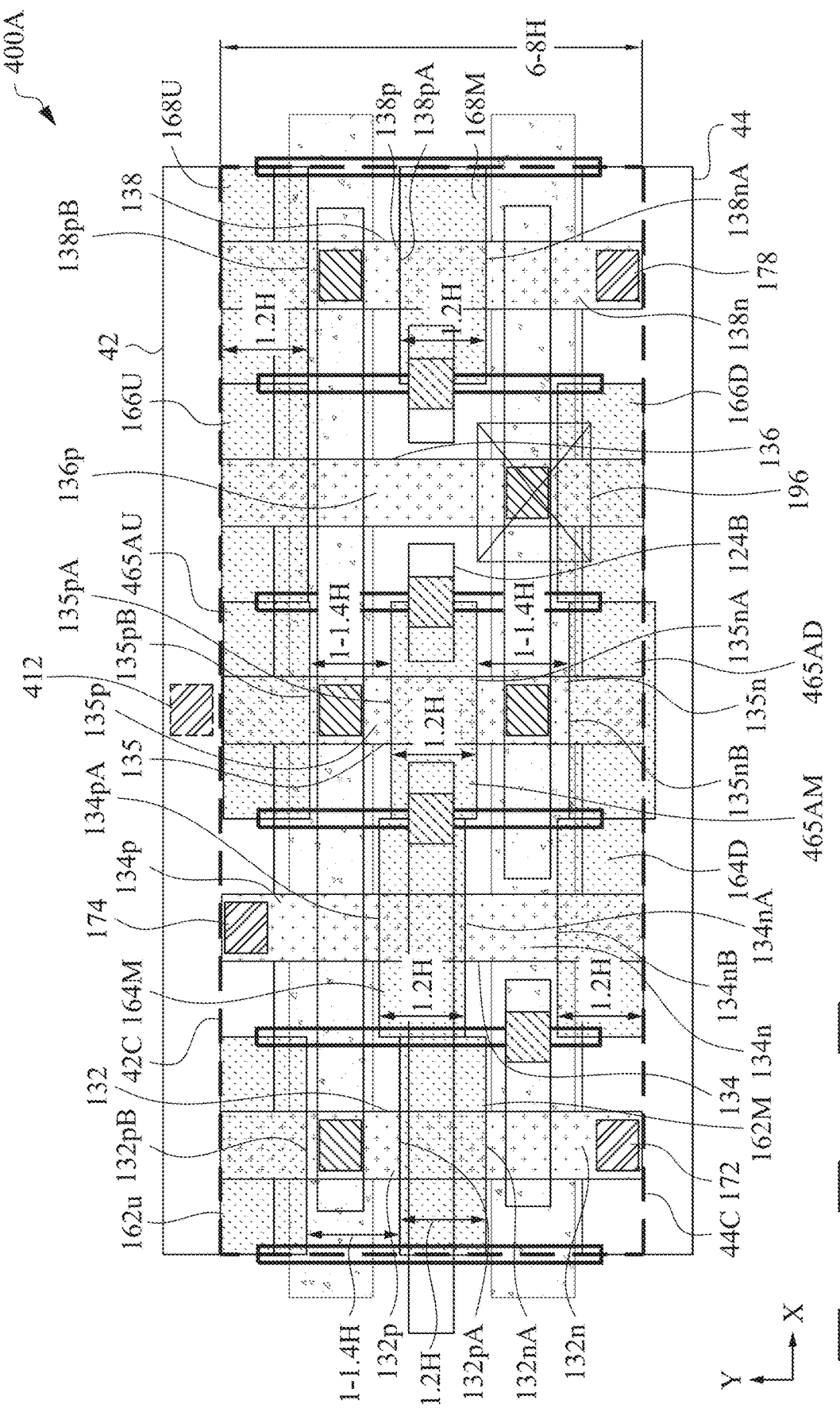
FIGS. 4A-4C are layout diagrams of AOI cells, in accordance with some embodiments.

Furthermore, when the terminal-conductor line cutting pattern for defining the distal edge 135*p*B of the conductor segment 135*p* is adjacent to the via-connector 412 in the first neighboring cell but the terminal-conductor line cutting pattern for defining the distal edge 135*n*B of the conductor segment 135*n* is not adjacent to a via-connector VD2 in a neighboring cell, the layout design of the AOI cell 400A in FIG. 4A is used as a circuit component in a larger circuit. When the terminal-conductor line cutting pattern for defining the distal edge 135*n*B of the conductor segment 135*n* is adjacent to the via-connector 414 in the second neighboring cell but the terminal-conductor line cutting pattern for defining the distal edge 135*p*B of the conductor segment 135*p* is not adjacent to a via-connector VD2 in a neighboring cell, the layout design of the AOI cell 400B in FIG. 4B is used as a circuit component in a larger circuit.

Figure 4B:
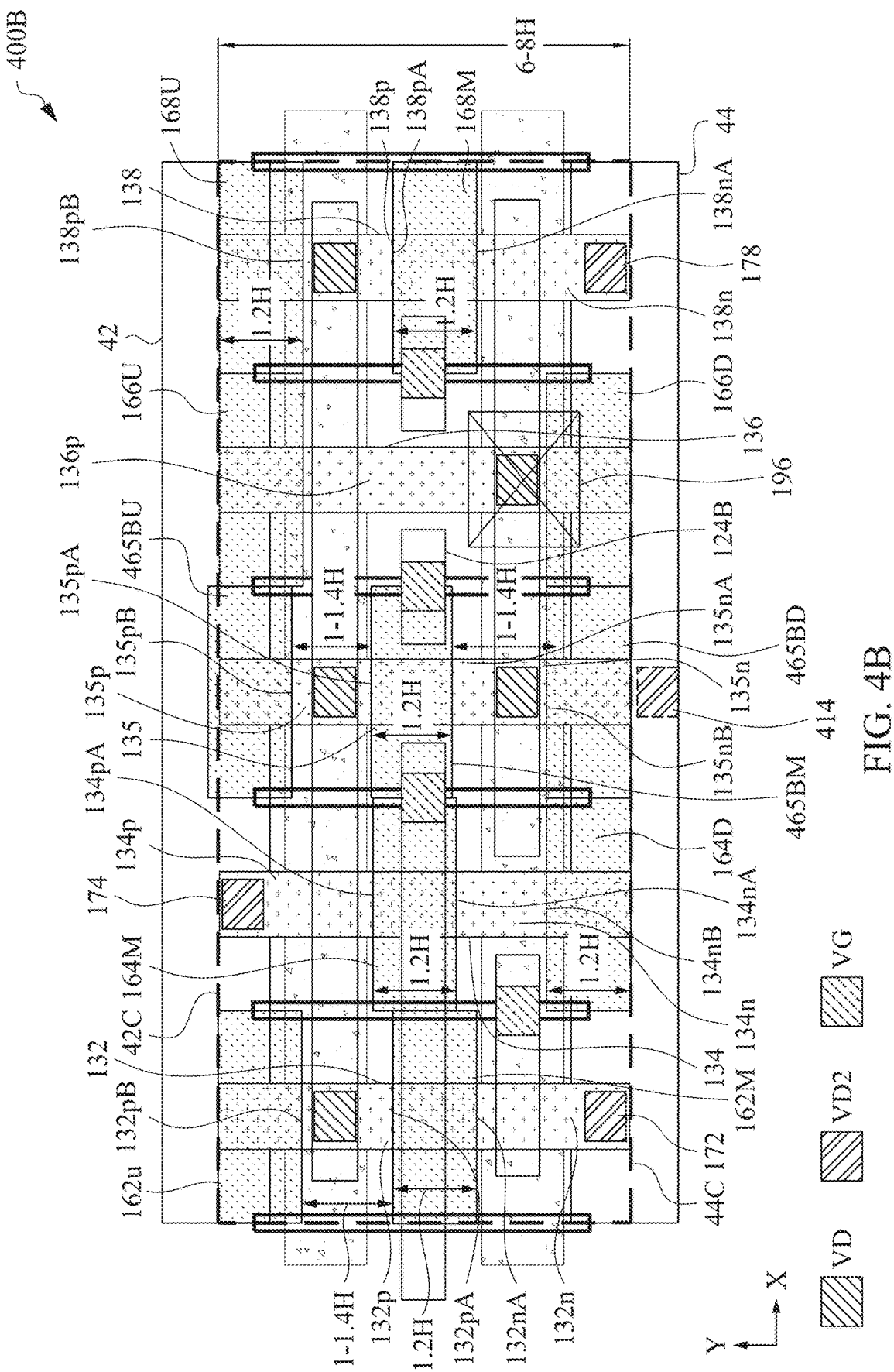
Figure 4C:
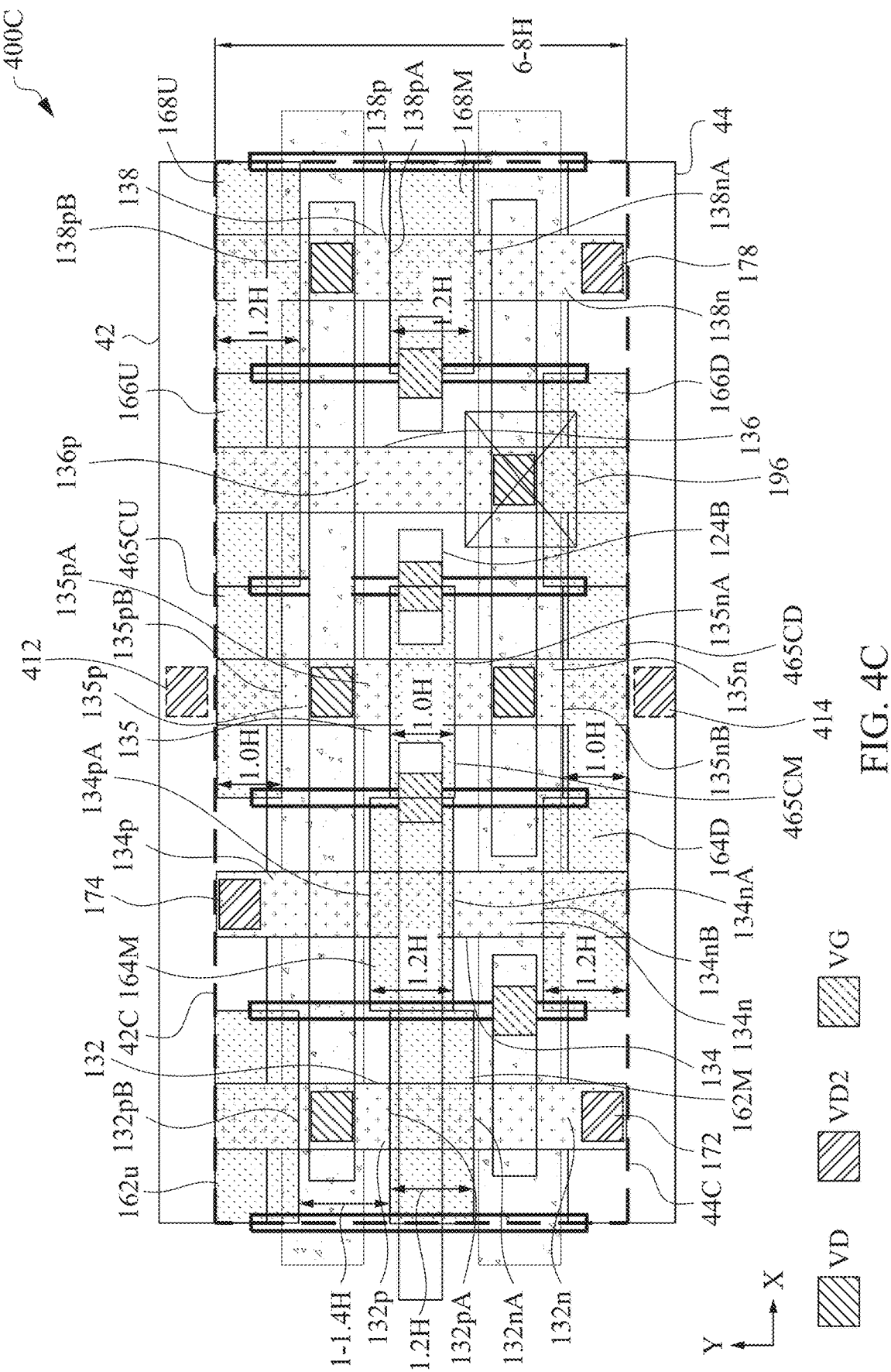

FIGS. 4A-4C are layout diagrams of AOI cells, in accordance with some embodiments. The layout diagram of the AOI cell 400A in FIG. 4A is modified from the layout diagram of the AOI cell 100 in FIG. 1B by substituting the terminal-conductor line cutting patterns 165U, 165M, and 165D correspondingly with the terminal-conductor line cutting patterns 465AU, 465AM, and 465AD. Like the height of the terminal-conductor line cutting patterns 165U, 165M, and 165D in FIG. 1B, the height of each of the terminal-conductor line cutting patterns 465AU, 465AM, and 465AD in FIG. 4A is also maintained at 1.2H. Each of the terminal-conductor line cutting patterns 465AU, 465AM, and 465AD in FIG. 4A; however, is shifted downwards (towards the negative Y-direction), as compared with the terminal-conductor line cutting patterns 165U, 165M, and 165D in FIG. 1B. Because of the position shifting of the terminal-conductor line cutting patterns 465AU, 465AM, and 465AD, the lengths of the conductor segments 135*p* and 135*n* are implemented in a range from 1.0H to 1.4H.

In FIG. 4A, a first horizontal edge of the terminal-conductor line cutting pattern 465AU defines the distal edge 135*p*B of the conductor segment 135*p*, and a second horizontal edge of the terminal-conductor line cutting pattern 465AU is aligned with the centerline 42C of the power rail 42. In some alternative embodiments, the terminal-conductor line cutting pattern 465AU is shifted downwards to leave a separation gap between the second horizontal edge of the terminal-conductor line cutting pattern 465AU and the centerline 42C of the power rail 42. A first horizontal edge of the terminal-conductor line cutting pattern 465AD defines the distal edge 135*n*B of the conductor segment 135*n*, and a second horizontal edge of the terminal-conductor line cutting pattern 465AD is in an area occupied by a neighboring cell at the other side of the centerline 44C of the power rail 44.

The layout diagram of the AOI cell 400B in FIG. 4B is modified from the layout diagram of the AOI cell 100 in FIG. 1B by substituting the terminal-conductor line cutting patterns 165U, 165M, and 165D correspondingly with the terminal-conductor line cutting patterns 465BU, 465BM, and 465BD. Like the heights of the terminal-conductor line cutting patterns 165U, 165M, and 165D in FIG. 1B, the height of each of the terminal-conductor line cutting patterns 465BU, 465BM, and 465BD in FIG. 4B is maintained at 1.2H. Each of the terminal-conductor line cutting patterns 465BU, 465BM, and 465BD in FIG. 4B, however, is shifted upwards (towards the positive Y-direction), as compared with the terminal-conductor line cutting patterns 165U, 165M, and 165D in FIG. 1B. Because of the position shifting of the terminal-conductor line cutting patterns 465BU, 465BM, and 465BD, the lengths of the conductor segments 135p and 135n are implemented in a range from 1.0H to 1.4H.

In FIG. 4B, a first horizontal edge of the terminal-conductor line cutting pattern 465BU defines the distal edge 135pB of the conductor segment 135p, and a second horizontal edge of the terminal-conductor line cutting pattern 465BU is in an area occupied by a neighboring cell at the other side of the centerline 42C of the power rail 42. A first horizontal edge of the terminal-conductor line cutting pattern 465BD defines the distal edge 135nB of the conductor segment 135n, and a second horizontal edge of the terminal-conductor line cutting pattern 465BD is aligned with the centerline 44C of the power rail 44. In some alternative embodiments, the second horizontal edge of the terminal-conductor line cutting pattern 465BD is shifted upwards to leave a separation gap between the second horizontal edge of the terminal-conductor line cutting pattern 465BD and the centerline 44C of the power rail 44.

The layout diagram of the AOI cell 400C in FIG. 4C is modified from the layout diagram of the AOI cell 100 in FIG. 1B by substituting the terminal-conductor line cutting patterns 165U, 165M, and 165D correspondingly with the terminal-conductor line cutting patterns 465CU, 465CM, and 465CD. While the height of each of the terminal-conductor line cutting patterns 165U, 165M, and 165D in FIG. 1B is 1.2H, the height of each of the terminal-conductor line cutting patterns 465CU, 465CM, and 465CD in FIG. 4C is reduced to 1.0H. Like the terminal-conductor line cutting pattern 165M in FIG. 1B, the terminal-conductor line cutting pattern 465CM in FIG. 4C is also positioned along the Y-direction at the middle position between the centerline 42C of the power rail 42 and the centerline 44C of the power rail 44. A first horizontal edge of the terminal-conductor line cutting pattern 465CU defines the distal edge 135pB of the conductor segment 135p, and a second horizontal edge of the terminal-conductor line cutting pattern 465CU is adjacent to a via-connector 412. A first horizontal edge of the terminal-conductor line cutting pattern 465CD defines the distal edge 135nB of the conductor segment 135n, and a second horizontal edge of the terminal-conductor line cutting pattern 465CD is adjacent to a via-connector 414.

In FIG. 4C, the second horizontal edge of the terminal-conductor line cutting pattern 465CU is aligned with the centerline 42C of the power rail 42, and the second horizontal edge of the terminal-conductor line cutting pattern 465CD is aligned with the centerline 44C of the power rail 44. In some alternative embodiments, the terminal-conductor line cutting pattern 465CU is shifted downwards to leave a separation gap between the second horizontal edge of the terminal-conductor line cutting pattern 465CU and the centerline 42C, whereby reducing the length of the conductor segment 135p. In some alternative embodiments, the terminal-conductor line cutting pattern 465CD is shifted upwards to leave a separation gap between the second horizontal edge of the terminal-conductor line cutting pattern 465CD and the centerline 44C, whereby reducing the length of the conductor segment 135n.

In some embodiments, the layout designs of the AOI cell 100 in FIG. 1B and the AOI cells 400A-400C in FIGS. 4A-4C are all included in a cell layout library. During the layout design process of an integrated circuit, when an AOI cell is needed as a component in the integrated circuit, one of the four layout designs of the AOI cell (i.e., one of the AOI cells 100, 400A, 400B, or 400C) is selected, and the selection depends upon the layout designs of other neighboring cells which are adjacent to the AOI cell subject to the selection.

Figure 5:
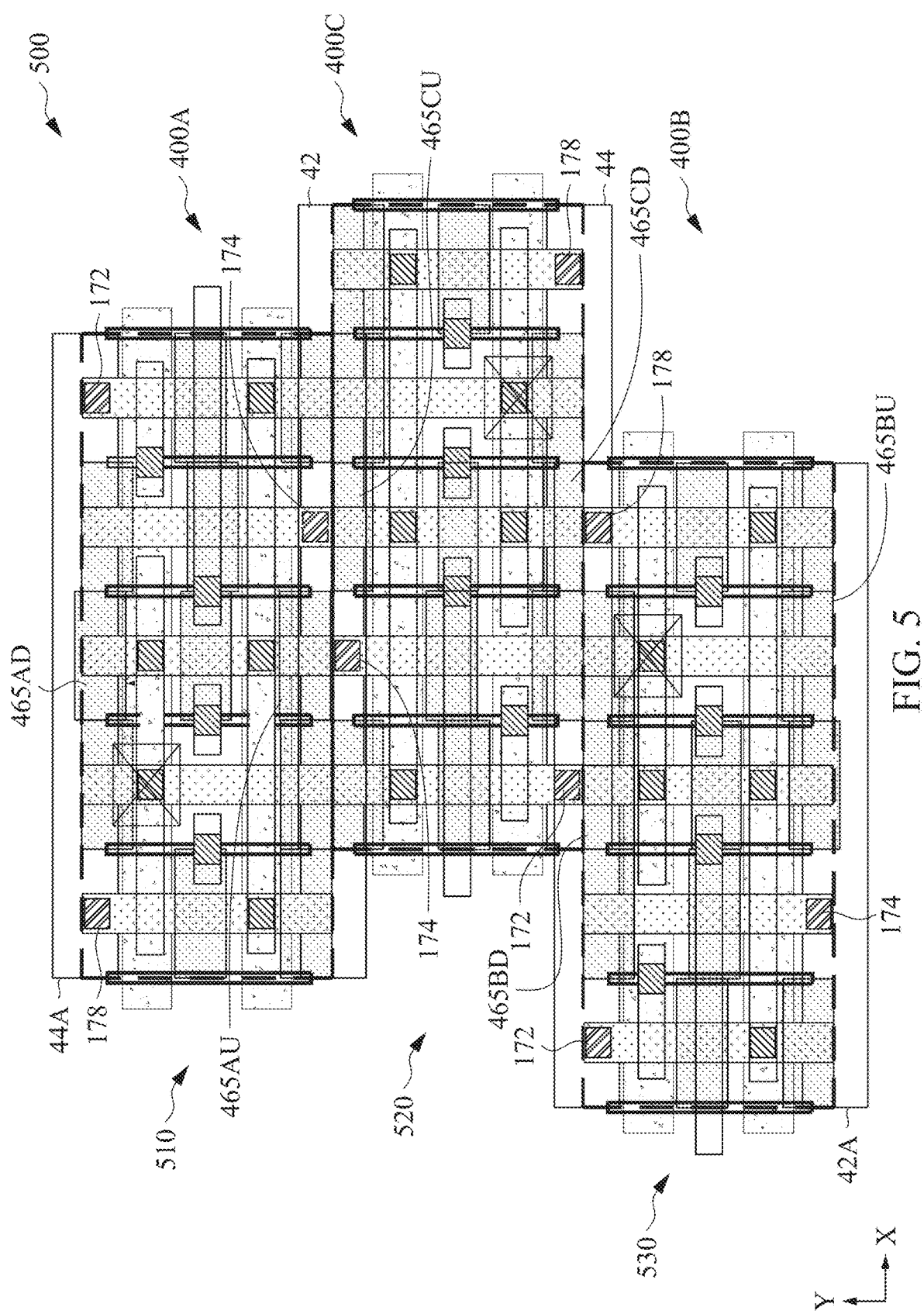
FIG. 5 is a layout diagram of an integrated circuit having three AOI cells, in accordance with some embodiments.

FIG. 5 is a layout diagram of an integrated circuit 500 having three AOI cells 510, 520, and 530, in accordance with some embodiments. The AOI cell 400A, the AOI cell 400C, and the AOI cell 400B are correspondingly selected as the AOI cells 510, 520, and 530. The layout of the AOI cell 400C in FIG. 5 is the same as the layout of the AOI cell 400C in FIG. 4C. The AOI cell 400C in FIG. 5 receives the first supply voltage VDD from the power rail 42 and receives the second supply voltage VSS from the power rail 44. The layout of the AOI cell 400A in FIG. 5 is obtained from FIG. 4A by flipping vertically the layout of the AOI cell 400A. The AOI cell 400A in FIG. 5 receives the first supply voltage VDD from the power rail 42 and receives the second supply voltage VSS from the power rail 44A. The layout of the AOI cell 400B in FIG. 5 is obtained from FIG. 4B by flipping vertically the layout of the AOI cell 400B. The AOI cell 400A in FIG. 5 receives the first supply voltage VDD from the power rail 42A and receives the second supply voltage VSS from the power rail 44.

In FIG. 5, the AOI cell 400A of FIG. 4A is selected as the AOI cell 510, because the terminal-conductor line cutting pattern 465AU in the AOI cell 510 is adjacent to the via-connector 174 in the AOI cell 520. The AOI cell 400C of FIG. 4C is selected as the AOI cell 520, because the terminal-conductor line cutting pattern 465CU in the AOI cell 520 is adjacent to the via-connector 174 in the AOI cell 510 and the terminal-conductor line cutting pattern 465CD in the AOI cell 520 is adjacent to the via-connector 178 in the AOI cell 530. The AOI cell 400B of FIG. 4B is selected as the AOI cell 530, because the terminal-conductor line cutting pattern 465BD in the AOI cell 530 is adjacent to the via-connector 172 in the AOI cell 520.

In the embodiments as shown in FIGS. 1A-1B and in FIGS. 4A-4C, the AOI cells 100 and 400A-400C are all designed with reduced lengths for some or all conductor segments because of the increased heights (e.g., 1.2H) of the terminal-conductor line cutting patterns, as compared with alternative designs in which the heights of the terminal-conductor line cutting patterns are maintained at the minimal value of 1.0H. In some embodiments, as shown in FIG. 6 and in FIGS. 7A-7B, the AOI cells 600 and 700A-700B are all designed with reduced cell heights while the heights of the terminal-conductor line cutting patterns are maintained at the minimal value of 1.0H.

Figure 6:
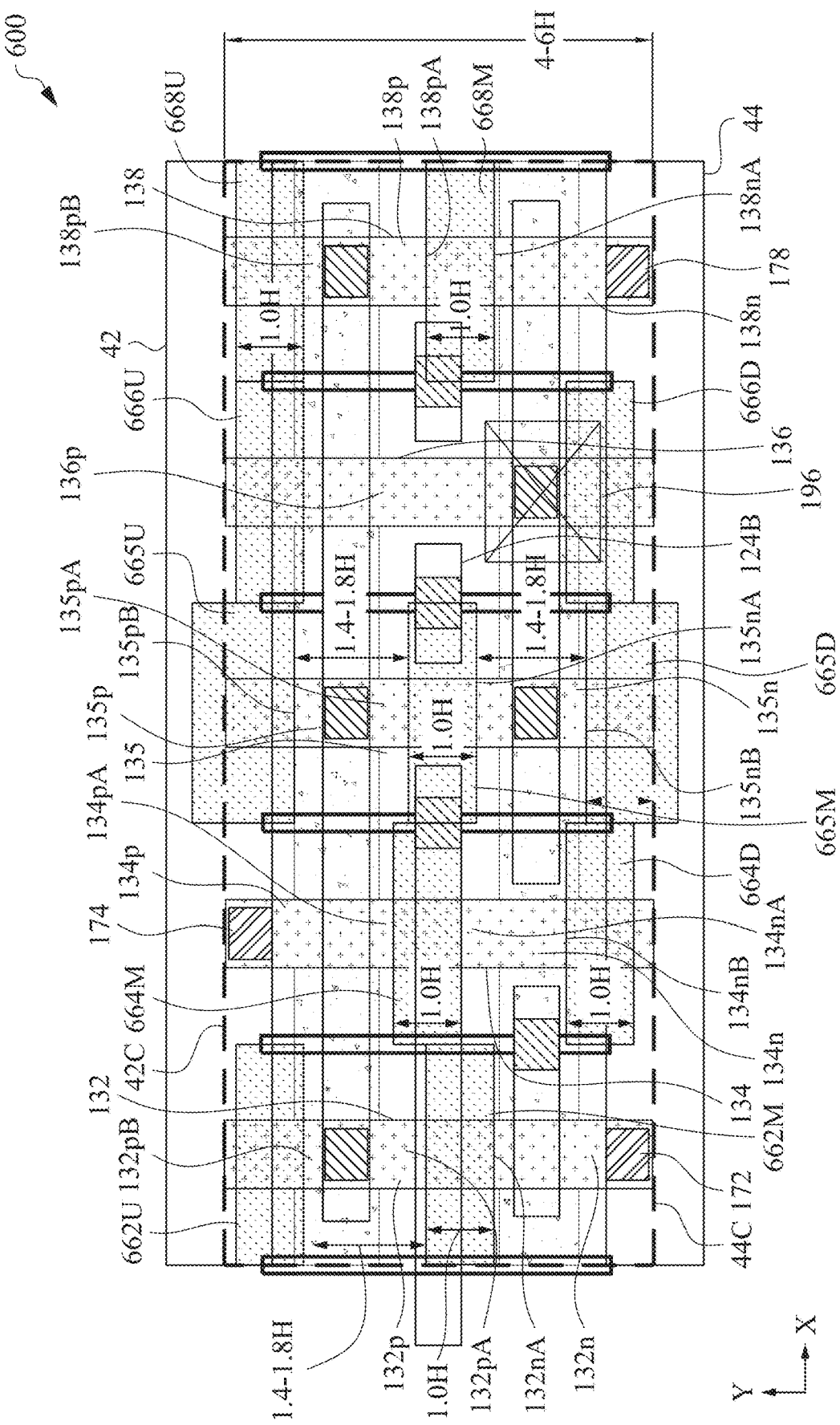
FIG. 6 is a layout diagram of an AOI cell having reduced cell height, in accordance with some embodiments.

FIG. 6 is a layout diagram of an AOI cell 600 having reduced cell height, in accordance with some embodiments. The layout diagram of the AOI cell 600 in FIG. 6 is modified from the layout diagram of the AOI cell 100 in FIG. 1B by substituting the terminal-conductor line cutting patterns 162U, 162M, 164M, 164D, 165U, 165M, 165D, 166U, 166D, 168U, and 168M correspondingly with the terminal-conductor line cutting patterns 662U, 662M, 664M, 664D, 665U, 665M, 665D, 666U, 666D, 668U, and 668M. While the height of each terminal-conductor line cutting pattern (162U, 162M, 164M, 164D, 165U, 165M, 165D, 166U, 166D, 168U, or 168M) in FIG. 1B is 1.2H, the height of each terminal-conductor line cutting pattern (662U, 662M, 664M, 664D, 665U, 665M, 665D, 666U, 666D, 668U, or 668M) in FIG. 6 is reduced to 1.0H. The vertical positions of some terminal-conductor line cutting patterns are also adjusted.

While the cell height of the AOI cell 100 in FIG. 1B is 6-8H, the cell height of the AOI cell 600 in FIG. 6 is reduced to 4-6H.

Just like the terminal-conductor line cutting patterns 162M and 168M in FIG. 1B, the positions of the terminal-conductor line cutting pattern 662M and 668M in FIG. 6 are also shifted downwards from the middle position between the centerline 42C of the power rail 42 and the centerline 44C of the power rail 44. The amount of the position shifting for each of the terminal-conductor line cutting patterns 662M and 668M in FIG. 6, however, is different from that for the terminal-conductor line cutting patterns 162M and 168M in FIG. 1B. Specifically, each of the terminal-conductor line cutting patterns 662M and 668M is shifted downwards from the middle position by a vertical distance that is in a range from 0.2H to 0.3H. In some embodiments, even though the lengths of the conductor segments 132$p$ and 132$n$ can be adjusted to optimize the stray capacitive coupling associated with each of the conductor segments 132$p$ and 132$n$ by changing the amount of the position shifting of the terminal-conductor line cutting pattern 662M, the minimal amount of the position shifting and the maximum amount of the position shifting are restricted by the design rules. Similarly, In some embodiments, even though the lengths of the conductor segments 138$p$ and 138$n$ can be adjusted to optimize the stray capacitive coupling associated with each of the conductor segments 138$p$ and 138$n$ by changing the amount of the position shifting of the terminal-conductor line cutting pattern 668M, the minimal amount of the position shifting and the maximum amount of the position shifting are restricted by the design rules.

Just like the terminal-conductor line cutting pattern 164M in FIG. 1B, the position of the terminal-conductor line cutting pattern 664M in FIG. 6 is also shifted upwards from the middle position between the centerline 42C of the power rail 42 and the centerline 44C of the power rail 44. Specifically, the terminal-conductor line cutting patterns 664M is shifted upwards from the middle position by a vertical distance that is in a range from 0.2H to 0.3H, which is different from the range of the position shifting for the terminal-conductor line cutting patterns 164M in FIG. 1B. In some embodiments, even though the lengths of the conductor segments 134$p$ and 134$n$ can be adjusted to optimize the stray capacitive coupling associated with each of the conductor segments 134$p$ and 134$n$ by changing the amount of the position shifting of the terminal-conductor line cutting pattern 664M, the minimal amount of the position shifting and the maximum amount of the position shifting are restricted by the design rules.

Just like the terminal-conductor line cutting patterns 165U and 165D in FIG. 1B, the position of the terminal-conductor line cutting patterns 665U and 665D in FIG. 6 are also adjusted along the Y-direction. Specifically, the position of the terminal-conductor line cutting pattern 665U is adjusted along the Y-direction to keep the length of the conductor segment 135$p$ in FIG. 6 in a range from 1.4H to 1.8H, and the position of the terminal-conductor line cutting pattern 665D is adjusted along the Y-direction to keep the length of the conductor segment 135$n$ in FIG. 6 also in a range from 1.4H to 1.8H. In contrast, the lengths of the conductor segments 135$p$ and 135$n$ in FIG. 1B are kept in the range from 1.0H to 1.4H. In FIG. 6, the upper edge of the terminal-conductor line cutting pattern 665U is not aligned with the centerline 42C of the power rail 42 but shifted upwards from the centerline 42C by a vertical distance that is in a range from 0.2H to 0.3H, and the lower edge of the terminal-conductor line cutting pattern 665D is not aligned with the centerline 44C of the power rail 44 but shifted downwards from the centerline 44C by a vertical distance that is in a range from 0.2H to 0.3H.

In some embodiments, the upper edge of the terminal-conductor line cutting pattern 665U is shifted upwards by at least a minimal amount to keep the length of the conductor segment 135$p$ larger than a minimal length as required by the design rules, while the upper edge of the terminal-conductor line cutting pattern 665U is not shifted upwards too much as to increase the associated stray capacitance unnecessarily. In some embodiments, the lower edge of the terminal-conductor line cutting pattern 665D is shifted downwards by at least a minimal amount to keep the length of the conductor segment 135$n$ larger than a minimal length as required by the design rules, while the lower edge of the terminal-conductor line cutting pattern 665D is not shifted downwards too much as to increase the associated stray capacitance unnecessarily. In some embodiments, when the conductor segment 135$p$ or the conductor segment 135$n$ is smaller than a minimal length as required by a default fabrication process, a remedial fabrication process is used to fabricate the AOI cell 600 in FIG. 6, provided that the lengths of the conductor segment 135$p$ and 135$n$ are not too small and are still larger than the minimal length as required by the remedial fabrication process. In one specific example, the default fabrication process requires one mask for fabricating the conducting lines in the first metal layer, but the remedial fabrication process requires two masks for fabricating the conducting lines in the first metal layer. Consequently, keeping the lengths of the conductor segment 135$p$ and 135$n$ larger than the minimal length as required by the design rules associated with the default fabrication process reduces the number of masks during fabrication.

When the layout design of the AOI cell 600 in FIG. 6 is placed in a layout design as a circuit component in a larger circuit, none of the terminal-conductor line cutting pattern 665U (for defining the distal edge 135$p$B of the conductor segment 135$p$) and the terminal-conductor line cutting pattern 665D (for defining the distal edge 135$n$B of the conductor segment 135$n$) is adjacent to a via-connector VD2 in a neighboring cell.

Figure 7A:
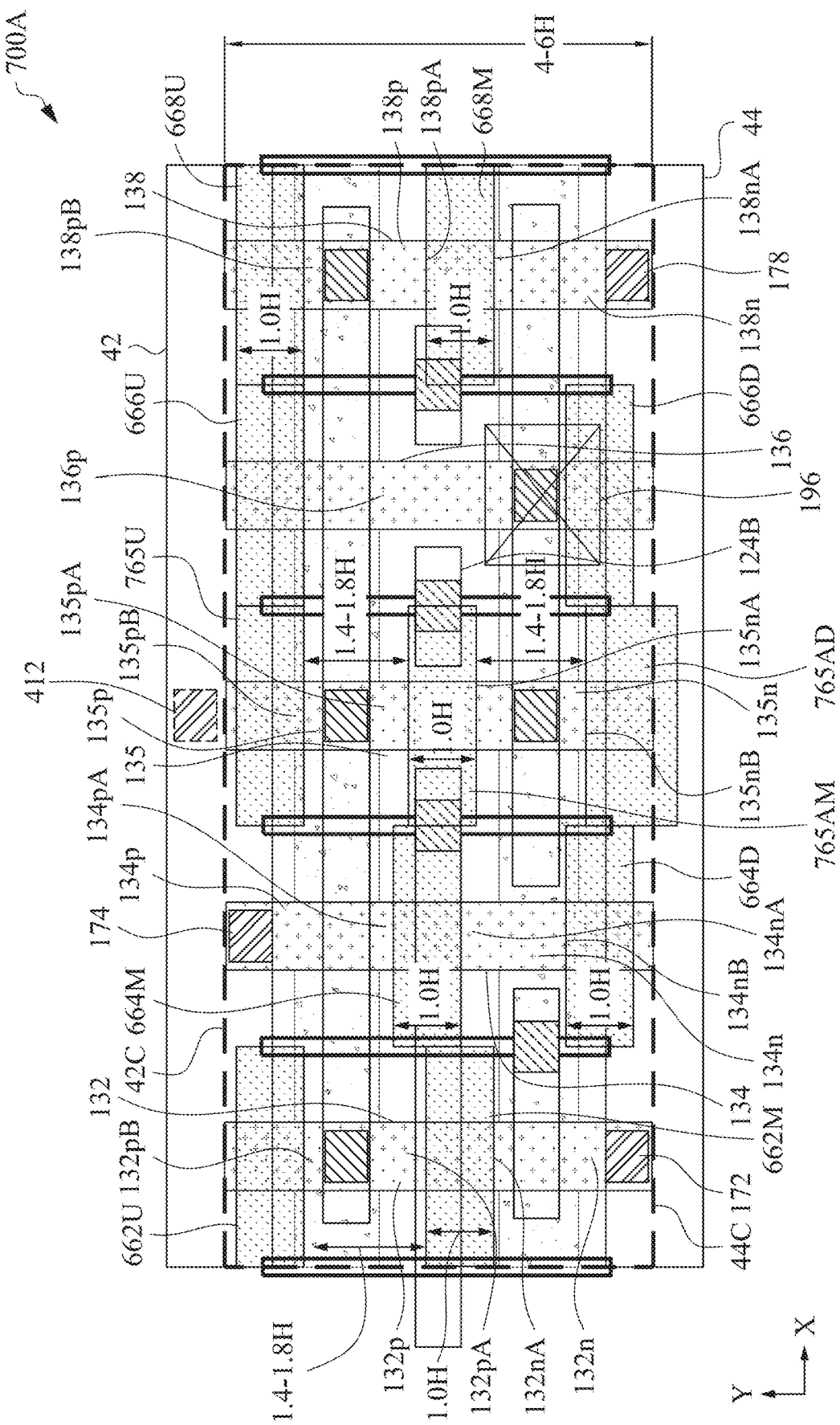
FIGS. 7A-7C are layout diagrams of AOI cells, in accordance with some embodiments.

When the terminal-conductor line cutting pattern for defining the distal edge 135$p$B of the conductor segment 135$p$ is adjacent to a via-connector 412 in a neighboring cell but the terminal-conductor line cutting pattern for defining the distal edge 135$n$B of the conductor segment 135$n$ is not adjacent to a via-connector VD2 in a neighboring cell, the layout design of the AOI cell 700A in FIG. 7A is used as a circuit component in a larger circuit. In FIG. 7A, the via-connector 412 is a via-connector VD2 that connects the power rail 42 to a conductor segment (not shown in the figure) in a neighboring cell.

Figure 7B:
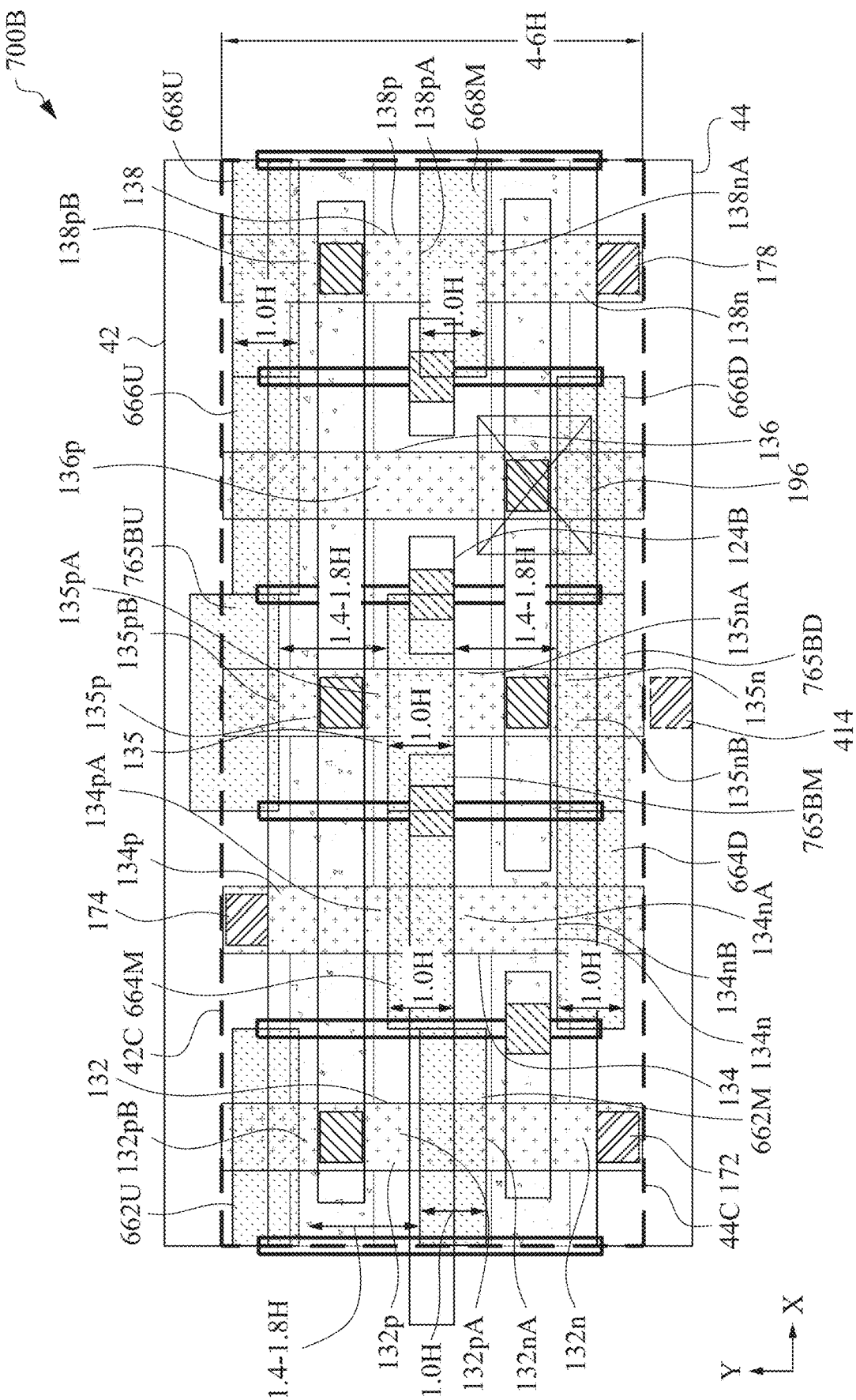

When the terminal-conductor line cutting pattern for defining the distal edge 135$n$B of the conductor segment 135$n$ is adjacent to a via-connector 414 in a neighboring cell but the terminal-conductor line cutting pattern for defining the distal edge 135$p$B of the conductor segment 135$p$ is not adjacent to a via-connector VD2 in a neighboring cell, the layout design of the AOI cell 700B in FIG. 7B is used as a circuit component in a larger circuit. In FIG. 7B, the via-connector 414 is a via-connector VD2 that connects the power rail 44 to a conductor segment (not shown in the figure) in a neighboring cell.

Figure 7C:
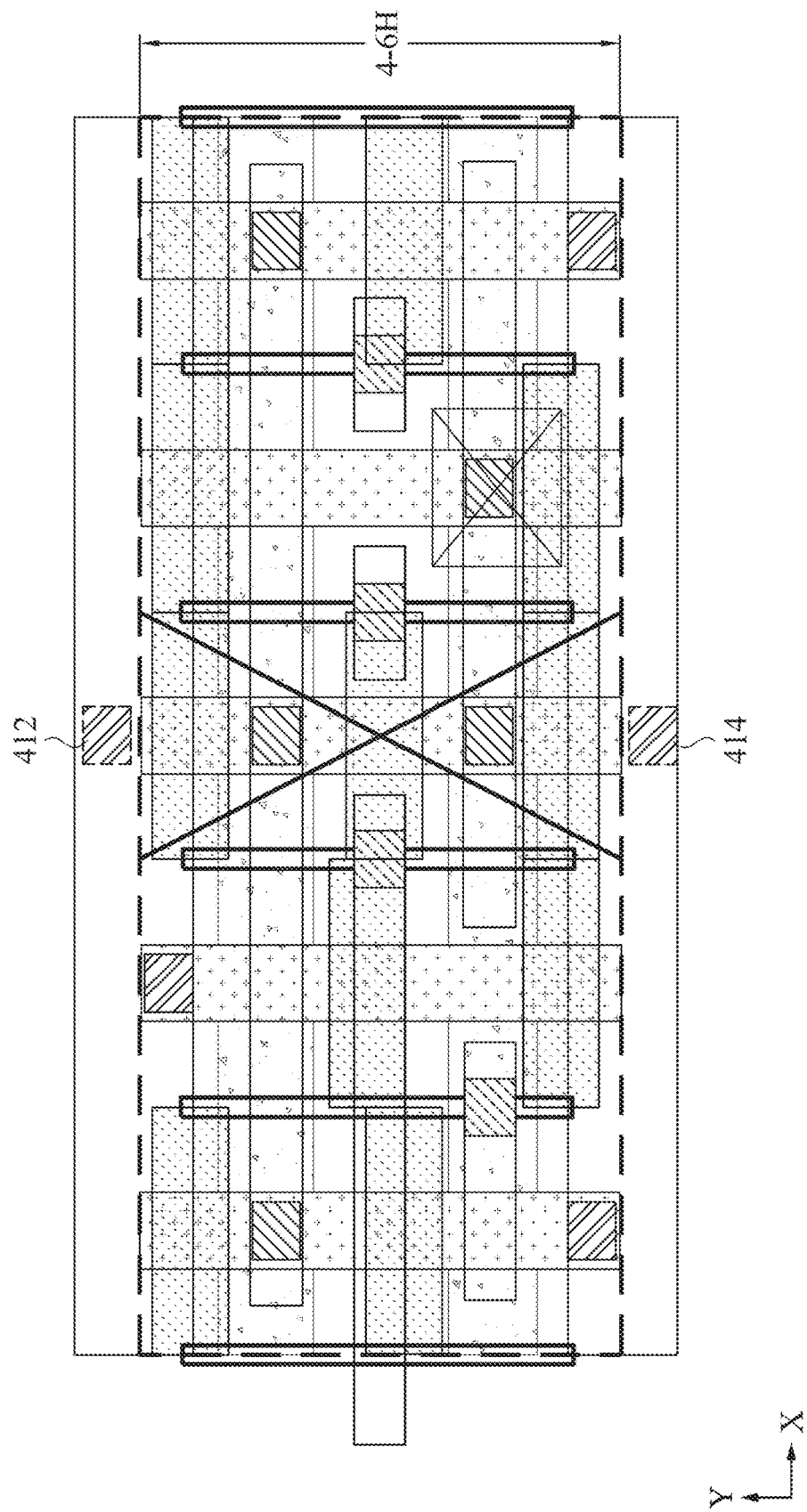

When the terminal-conductor line cutting pattern for defining the distal edge 135$p$B of the conductor segment 135$p$ is adjacent to a via-connector 412 in a first neighboring cell and the terminal-conductor line cutting pattern for defining the distal edge 135nB of the conductor segment 135n is adjacent to a via-connector 414 in a second neighboring cell, the layout arrangement in FIG. 7C constitutes a violation of the design rules. One remedy for the design rule violation is to shift the layout position of the AOI cell 700C horizontally (i.e., along the X-direction) to a new position where the AOI cell 700C can be substituted with one of the AOI cells 600, 700A, or 700B. Other remedies include shifting the layout positions of the neighboring cells adjacent to the AOI cell 700C to new positions until the AOI cell 700C can be substituted with one of the AOI cells 600, 700A, or 700B.

FIGS. 7A-7B are layout diagrams of AOI cells, in accordance with some embodiments. The layout diagrams of the AOI cells 700A-700B in FIGS. 7A-7B are modified from the layout diagram of the AOI cell 600 in FIG. 6.

The layout diagram of the AOI cell 700A in FIG. 7A is modified from the layout diagram of the AOI cell 600 in FIG. 6 by substituting the terminal-conductor line cutting patterns 665U, 665M, and 665D correspondingly with the terminal-conductor line cutting patterns 765AU, 765AM, and 765AD. Like the height of the terminal-conductor line cutting patterns 665U, 665M, and 665D in FIG. 6, the height of each of the terminal-conductor line cutting patterns 765AU, 765AM, and 765AD in FIG. 7A is also maintained at 1.0H. Each of the terminal-conductor line cutting patterns 765AU, 765AM, and 765AD in FIG. 7A, however, is shifted downwards, as compared with the terminal-conductor line cutting patterns 665U, 665M, and 665D in FIG. 6. Because of the position shifting of the terminal-conductor line cutting patterns 765AU, 765AM, and 765AD, the lengths of the conductor segments 135p and 135n are implemented in a range from 1.4H to 1.8H.

In FIG. 7A, the lower edge of the terminal-conductor line cutting pattern 765AU defines the distal edge 135pB of the conductor segment 135p, and the upper edge of the terminal-conductor line cutting pattern 765AD defines the distal edge 135nB of the conductor segment 135n. The upper edge of the terminal-conductor line cutting pattern 765AM defines the proximal edge 135pA of the conductor segment 135p, and the lower edge of the terminal-conductor line cutting pattern 765AM defines the proximal edge 135nA of the conductor segment 135n. The upper edge of the terminal-conductor line cutting pattern 765AU is aligned with the centerline 42C of the power rail 42. In some alternative embodiments, the terminal-conductor line cutting pattern 765AU is shifted downwards to leave a separation gap between the second horizontal edge of the terminal-conductor line cutting pattern 765AU and the centerline 42C of the power rail 42. The lower edge of the terminal-conductor line cutting pattern 665AD is not aligned with the centerline 44C of the power rail 44 but shifted downwards from the centerline 44C by a vertical distance that is in a range from 0.2H to 0.3H. The terminal-conductor line cutting pattern 665AM is shifted downwards from the middle position between the centerline 42C of the power rail 42 and the centerline 44C of the power rail 44, and the amount of the shifting of the terminal-conductor line cutting pattern 665AM is in a range from 0.2H to 0.3H.

The layout diagram of the AOI cell 700B in FIG. 7B is modified from the layout diagram of the AOI cell 600 in FIG. 6 by substituting the terminal-conductor line cutting patterns 665U, 665M, and 665D correspondingly with the terminal-conductor line cutting patterns 765BU, 765BM, and 765BD. Like the heights of the terminal-conductor line cutting patterns 665U, 665M, and 665D in FIG. 6, the height of each of the terminal-conductor line cutting patterns 765BU, 765BM, and 765BD in FIG. 7B is maintained at 1.0H. Each of the terminal-conductor line cutting patterns 765BU, 765BM, and 765BD in FIG. 7B, however, is shifted upwards, as compared with the terminal-conductor line cutting patterns 665U, 665M, and 665D in FIG. 6. Because of the position shifting of the terminal-conductor line cutting patterns 765BU, 765BM, and 765BD, the lengths of the conductor segments 135p and 135n are implemented in a range from 1.4H to 1.8H.

In FIG. 7B, the lower edge of the terminal-conductor line cutting pattern 765BU defines the distal edge 135pB of the conductor segment 135p, and the upper edge of the terminal-conductor line cutting pattern 765BD defines the distal edge 135nB of the conductor segment 135n. The upper edge of the terminal-conductor line cutting pattern 765BM defines the proximal edge 135pA of the conductor segment 135p, and the lower edge of the terminal-conductor line cutting pattern 765BM defines the proximal edge 135nA of the conductor segment 135n.

The upper edge of the terminal-conductor line cutting pattern 665BU is not aligned with the centerline 42C of the power rail 42 but shifted upwards from the centerline 42C by a vertical distance that is in a range from 0.2H to 0.3H. The lower edge of the terminal-conductor line cutting pattern 765BD is aligned with the centerline 44C of the power rail 44. In some alternative embodiments, the terminal-conductor line cutting pattern 765BD is shifted upwards to leave a separation gap between the second horizontal edge of the terminal-conductor line cutting pattern 765BD and the centerline 44C of the power rail 44. The terminal-conductor line cutting pattern 665BM is shifted upwards from the middle position between the centerline 42C of the power rail 42 and the centerline 44C of the power rail 44, and the amount of the shifting of the terminal-conductor line cutting pattern 665BM is in a range from 0.2H to 0.3H.

Figure 8C:
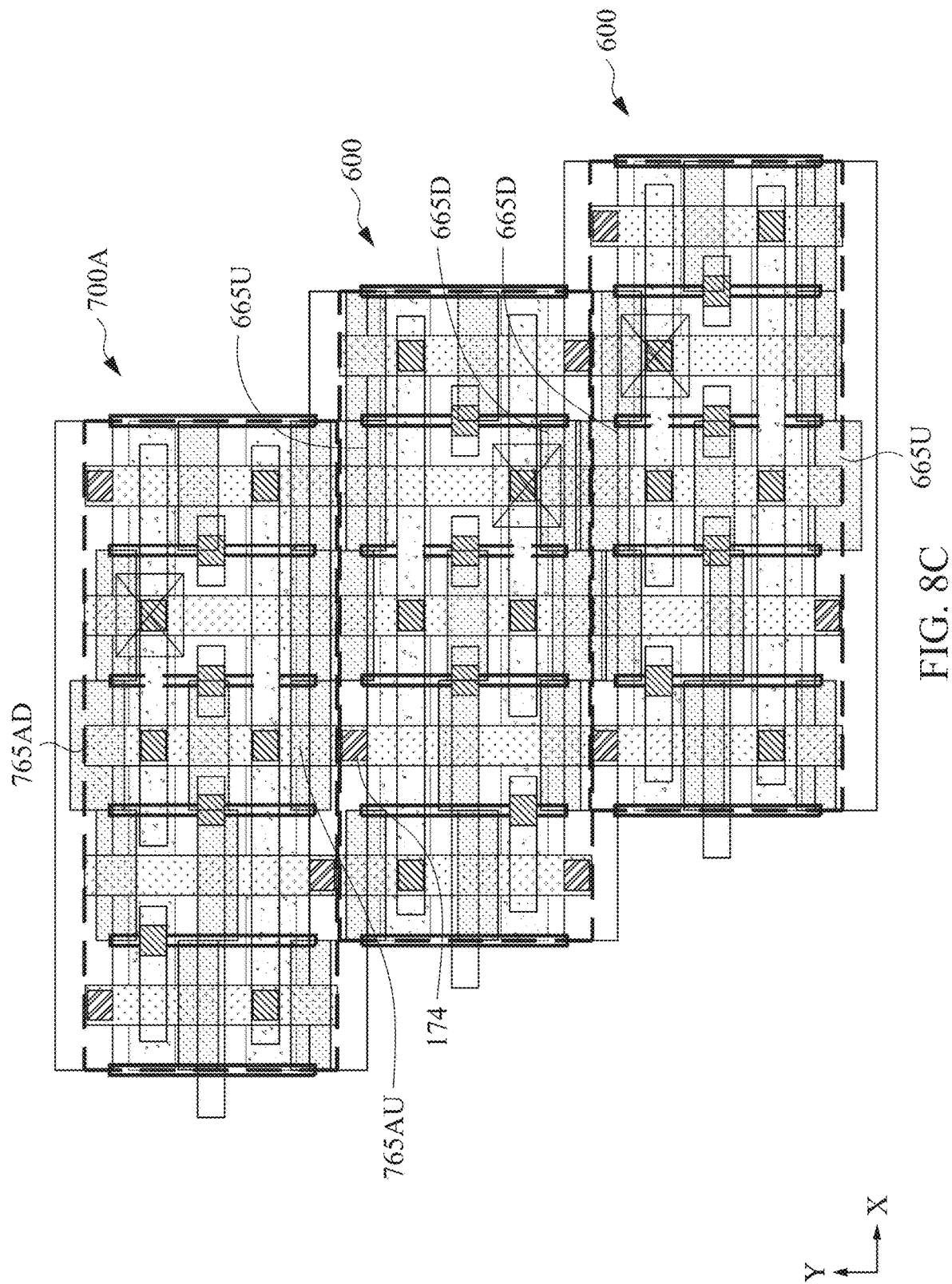

FIGS. 8A-8C are layout diagrams of integrated circuits 800A-800C having three AOI cells 810, 820, and 830, in accordance with some embodiments. In FIG. 8A, if a first AOI cell 600 is selected as the AOI cell 810 and a second AOI cell 600 is selected as the AOI cell 830, then, none of the AOI cells 600 and 700A-700B can be selected as the AOI cell 820. In FIG. 8A, the via-connector 174 in the AOI cell 810 is adjacent to the terminal-conductor line cutting pattern (e.g., 765CU) for defining the distal edge 135pB of the conductor segment 135p, and the via-connector 172 in the AOI cell 830 is adjacent to the terminal-conductor line cutting pattern (e.g., 765CD) for defining the distal edge 135nB of the conductor segment 135n. Any selection for the AOI cell 820 would cause a design rule violation, just like the design rule violation in the layout arrangement in FIG. 7C. The design rule violation, however, can be resolved by shifting the AOI cell 820 and/or the AOI cell 830 horizontally (i.e., along the X-direction).

The layout diagram in FIG. 8B is a modification of the layout diagram in FIG. 8A by shifting the AOI cell 830 in FIG. 8A horizontally to the left. In FIG. 8B, a first AOI cell 600 is selected as the AOI cell 810 and a second AOI cell 600 is selected as the AOI cell 830. Additionally, an AOI cell 700A is selected as the AOI cell 820. The layout of the AOI cell 820 in FIG. 8B is the same as the layout of the AOI cell 700A in FIG. 7A. The layout of the AOI cell 810 in FIG. 8B is obtained by flipping vertically the layout of the AOI cell 600 in FIG. 6. The layout of the AOI cell 830 in FIG. 8B is also obtained by flipping vertically the layout of the AOI cell 600 in FIG. 6.

In FIG. 8B, the two AOI cell 600 are selected as the AOI cells 810 and 830, because none of the terminal-conductor line cutting patterns 665U and 665D is adjacent to a via-connector VD2 (e.g., 172, 174, or 178) in a neighboring cell. The AOI cell 700A is selected as the AOI cell 820, because the terminal-conductor line cutting pattern (i.e., 765AU) for defining the distal edge 135pB of the conductor segment 135p is adjacent to a via-connector VD2 (i.e., 174) in the AOI cell 810 but the terminal-conductor line cutting pattern (i.e., 765AD) for defining the distal edge 135nB of the conductor segment 135n is not adjacent to a via-connector VD2 (e.g., 172, 174, or 178) in the AOI cell 830.

As another example remedy, the design rule violation in FIG. 8A is resolved by shifting both the AOI cell 810 and the AOI cell 830 horizontally, and the resulting layout diagram is shown in FIG. 8C. An AOI cell 700A is selected as the AOI cell 810, a first AOI cell 600 is selected as the AOI cell 820, and a second AOI cell 600 is selected as the AOI cell 830. The layout of the AOI cell 810 in FIG. 8C is obtained by flipping vertically the layout of the AOI cell 700A in FIG. 7A. The layout of the AOI cell 820 in FIG. 8C is the same as the layout of the AOI cell 600 in FIG. 6. The layout of the AOI cell 830 in FIG. 8C is obtained by flipping vertically the layout of the AOI cell 600 in FIG. 6.

In FIG. 8C, the AOI cell 700A is selected as the AOI cell 810, because the terminal-conductor line cutting pattern (i.e., 765AU) for defining the distal edge 135pB of the conductor segment 135p is adjacent to a via-connector VD2 (i.e., 174) in the AOI cell 820 but the terminal-conductor line cutting pattern (i.e., 765AD) for defining the distal edge 135nB of the conductor segment 135n is not adjacent to a via-connector VD2 in a neighboring cell. The two AOI cell 600 are selected as the AOI cells 820 and 830, because none of the terminal-conductor line cutting patterns 665U and 665D in the AOI cells 820 and 830 is adjacent to a via-connector VD2 (e.g., 172, 174, or 178) in a neighboring cell.

Figure 9:
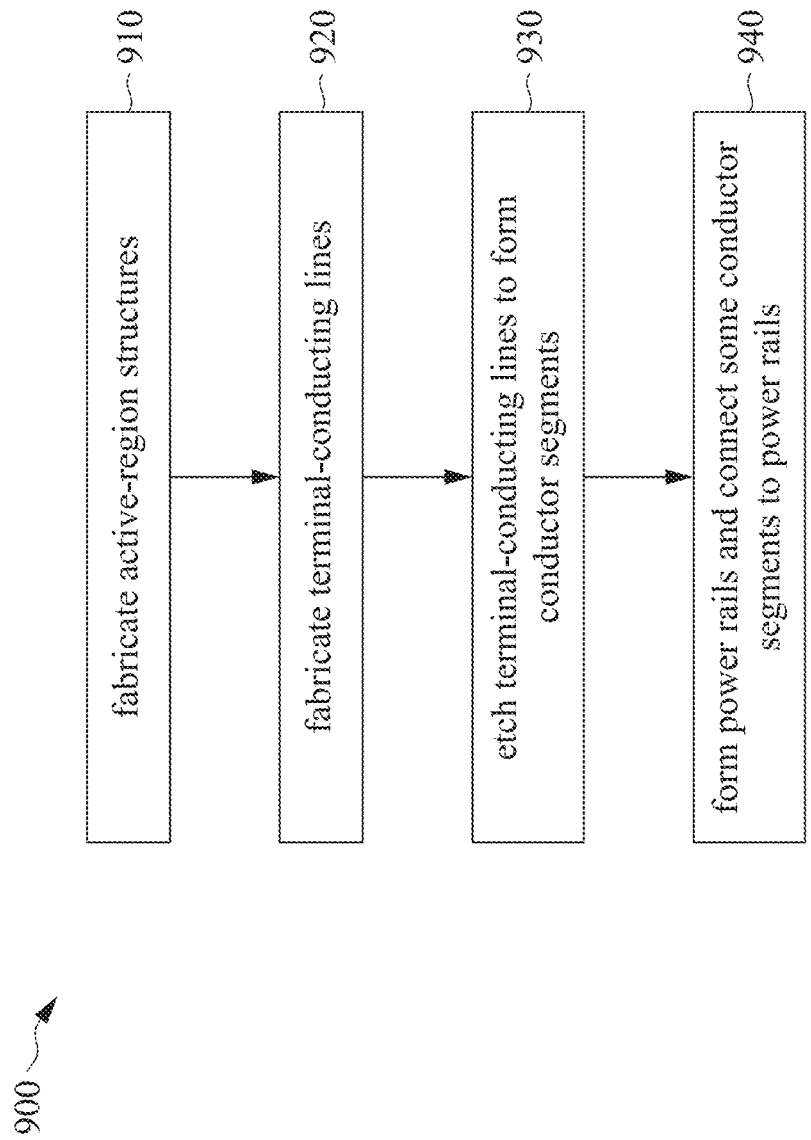
FIG. 9 is a flowchart of a method of manufacturing an integrated circuit, in accordance with some embodiments.

FIG. 9 is a flowchart of a method 900 of manufacturing an integrated circuit, in accordance with some embodiments. The sequence in which the operations of method 900 are depicted in FIG. 9 is for illustration only; the operations of method 900 are capable of being executed in sequences that differ from that depicted in FIG. 9. It is understood that additional operations may be performed before, during, and/or after the method 900 depicted in FIG. 9, and that some other processes may only be briefly described herein.

In operation 910 of method 900, active-region structures are fabricated on a substrate. In the example embodiments as shown in FIGS. 2A-2C and FIGS. 3A-3E, the active-region structure 80p and the active-region structure 80n are fabricated on the substrate 20. Each of the active-region structure 80p and the active-region structure 80n extends in the X-direction. Examples of the active-region structures fabricated in operation 910 include fin structures, nano-sheet structures, and nano-wire structures.

In operation 920 of method 900, terminal-conductor lines intersecting the active-region structures are fabricated. In some embodiments, the terminal-conductor lines (i.e., the source-or-drain-conductors) are referred to as MD conductors. In the example embodiments of the integrated circuit as specified by the layout diagrams in FIGS. 1A-1B, the terminal-conductor lines 132, 134, 135, 136, and 138 intersecting the active-region structures 80p and 80n are fabricated. In FIGS. 3A-3E, only segments of the terminal-conductor lines are depicted.

In operation 930 of method 900, terminal-conductor lines are etched to form conductor segments. In some embodiments, the portions of the terminal-conductor lines that need to be removed are exposed within the mask openings as defined by the terminal-conductor line cutting patterns. For example, for forming the integrated circuit as specified by the layout diagrams in FIGS. 1A-1B, exposed portions of the terminal-conductor lines are specified by the terminal-conductor line cutting patterns 162U, 162M, 164M, 164D, 165U, 165M, 165D, 166U, 166D, 168U, and 168M in the layout diagrams.

In operation 930, after the exposed portions of the terminal-conductor line 132 as specified by the terminal-conductor line cutting patterns 162U and 164M are removed by etching processes, the terminal-conductor line 132 are divided into two conductor segments 132p and 132n that are separated by the separation distances S2aa, as shown in FIG. 3A. After the exposed portions of the terminal-conductor line 134 as specified by the terminal-conductor line cutting patterns 164M and 164D are removed by etching processes, the terminal-conductor line 134 are divided into two conductor segments 134p and 134n that are separated by the separation distances S4aa, as shown in FIG. 3B. After the exposed portions of the terminal-conductor line 135 as specified by the terminal-conductor line cutting patterns 165U, 165M, and 165D are removed by etching processes, the terminal-conductor line 135 are divided into two conductor segments 135p and 135n that are separated by the separation distances S5aa, as shown in FIG. 3C. After the exposed portions of the terminal-conductor line 136 as specified by the terminal-conductor line cutting patterns 166U and 166D are removed by etching processes, the terminal-conductor line 136 becomes a shortened conductor segments 136p, as shown in FIG. 3D. After the exposed portions of the terminal-conductor line 138 as specified by the terminal-conductor line cutting patterns 168U and 168M are removed by etching processes, the terminal-conductor line 138 are divided into two conductor segments 138p and 138n that are separated by the separation distances S8aa, as shown in FIG. 3E.

In operation 940 of method 900, power rails are formed and some conductor segments are connected to the power rails through via-connectors. In the example embodiments as shown in FIGS. 2A-2C and FIGS. 3A-3E, power rails 42 and 44 are fabricated a first metal layer M0 overlying the insulation layer 22. In FIG. 3A, the conductor segment 132n is connected to the power rail 44 through a via-connector VD2. In FIG. 3B, the conductor segment 134p is connected to the power rail 42 through a via-connector VD2. In FIG. 3E, the conductor segment 138n is connected to the power rail 44 through a via-connector VD2.

In the integrated circuits fabricated with the method 900 according to a specification of the layout diagram in any one of FIGS. 1A-1B, FIGS. 4A-4C, FIG. 6, and FIGS. 7A-7B, at least one terminal-conductor line is divided into two segments, and the proximal edges of the two segments have different vertical distances to a corresponding power rail. For example, a first vertical distance from a centerline 42C of the power rail 42 to the proximal edge of a first conductor segment (e.g., 132p, 143p, or 138p) is different from a second vertical distance from a centerline 44C of the power rail 44 to the proximal edge of a second conductor segment (e.g., 132n, 143n, or 138n) by a predetermined vertical distance. The predetermined vertical distance characterizing the difference between the first vertical distance and the second vertical distance is a fraction of the basic height unit H. In the AOI cell 100 of FIGS. 1A-1B and the AOI cells 400A-400C of FIG. 4A-4C, the predetermined vertical distance characterizing the difference is in a range between from 0.2H to 0.4H. In the AOI cell 600 of FIG. 6 and the AOI cells 700A-700B of FIG. 7A-7B, the predetermined vertical distance characterizing the difference is in a range between from 0.4H to 0.6H.

Figure 10:
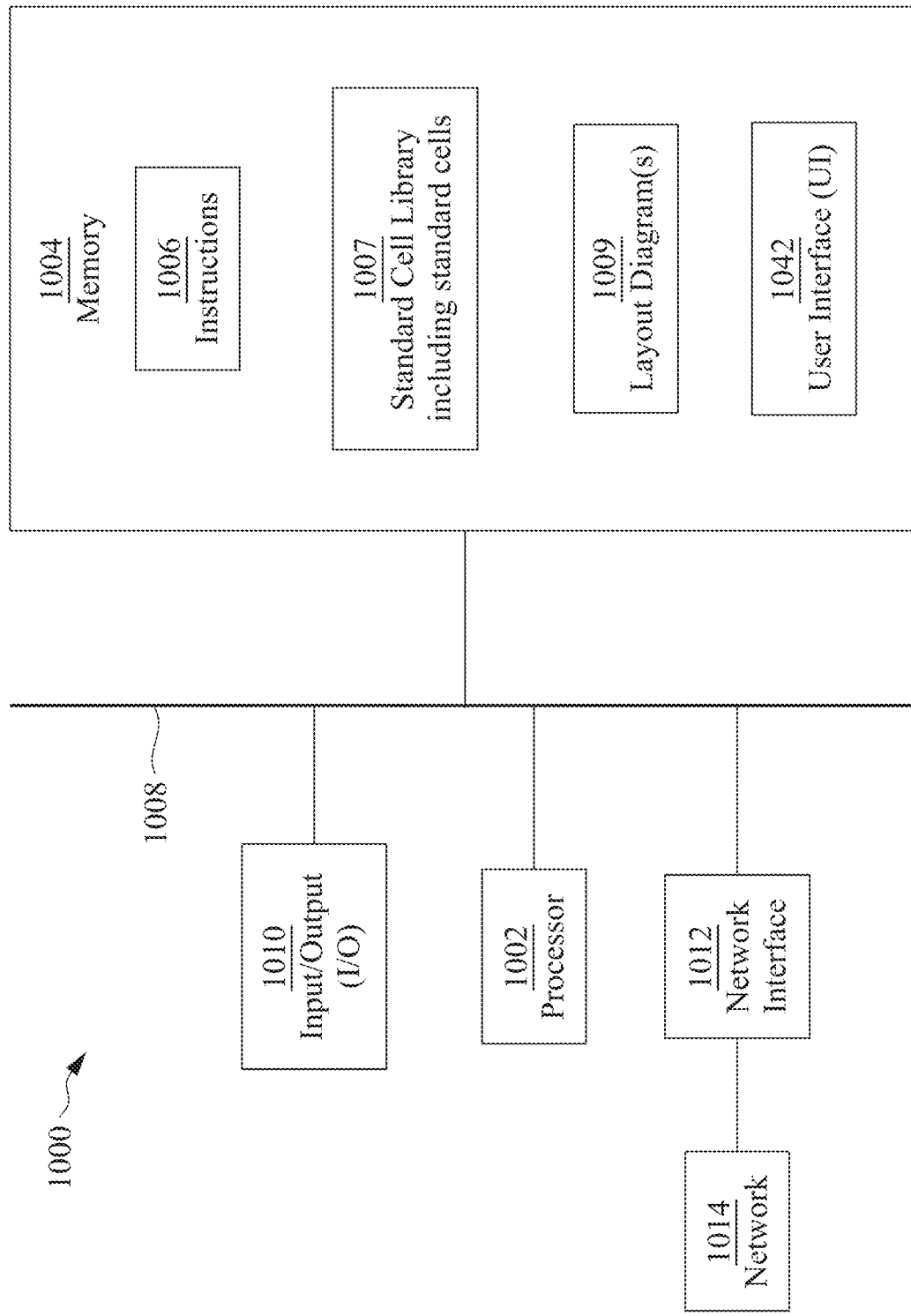
FIG. 10 is a block diagram of an electronic design automation (EDA) system in accordance with some embodiments.

FIG. 10 is a block diagram of an electronic design automation (EDA) system 1000 in accordance with some embodiments.

In some embodiments, EDA system 1000 includes an APR system. Methods described herein of designing layout diagrams represent wire routing arrangements, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores library 1007 of standard cells including such standard cells as disclosed herein. In one or more embodiments, storage medium 1004 stores one or more layout diagrams 1009 corresponding to one or more layouts disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
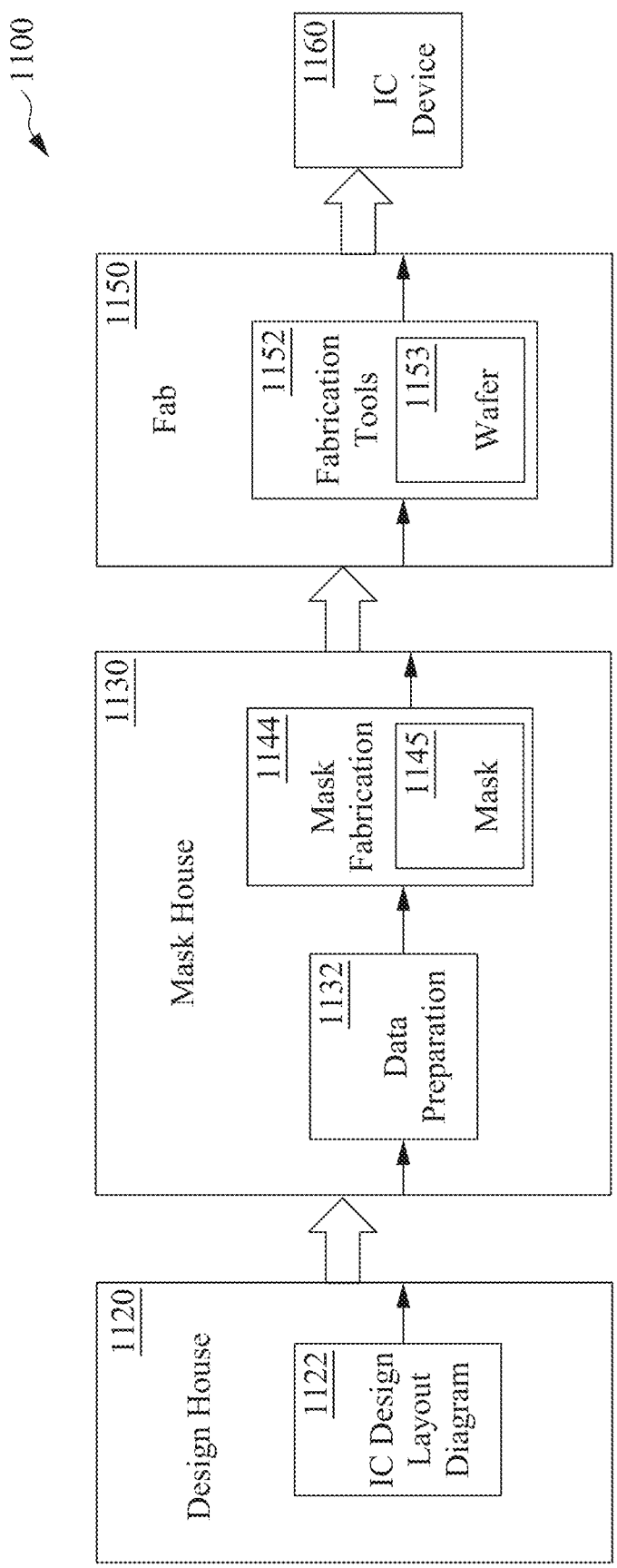
FIG. 11 is a block diagram of an integrated circuit (IC) manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to an integrated circuit. The integrated circuit includes a first active-region structure and a second active-region structure extending in a first direction perpendicular to a second direction, and a first terminal-conductor line extending in the second direction while bounded between a first horizontal cell boundary and a second horizontal cell boundary extending in the first direction. The first terminal-conductor line has a first conductor segment and a second conductor segment separated at proximal edges by a first separation distance. The first conductor segment of the first terminal-conductor line intersects the first active-region structure, and the second conductor segment of the first terminal-conductor line intersects the second active-region structure. A first vertical distance along the second direction from the first horizontal cell boundary to a proximal edge of the first conductor segment of the first terminal-conductor line is different from a second vertical distance along the second direction from the second horizontal cell boundary to a proximal edge of the second conductor segment of the first terminal-conductor line. The first vertical distance is larger than the second vertical distance by a first predetermined vertical distance that is a fraction of the first separation distance. A vertical distance along the second direction from the second horizontal cell boundary to a distal edge of the first conductor segment of the first terminal-conductor line is equal to the first separation distance.

Another aspect of the present disclosure also relates to an integrated circuit. The integrated circuit includes a first power rail and a second power rail extending in a first direction, a first active-region structure and a second active-region structure extending in a first direction, and a first terminal-conductor line having a first conductor segment and a second conductor segment and extending in a second direction perpendicular to the first direction. The first conductor segment and the second conductor segment of the first terminal-conductor line are separated at proximal edges by a first separation distance. The first conductor segment of the first terminal-conductor line intersects the first active-region structure and has a distal edge separated along the second direction from the first power rail. The second conductor segment of the first terminal-conductor line intersects the second active-region structure and is connected to the second power rail through a first via-connector. The integrated circuit also includes a second terminal-conductor line having a first conductor segment and a second conductor segment and extending in the second direction. The first conductor segment and the second conductor segment of the second terminal-conductor line are separated at proximal edges by the first separation distance. The first conductor segment of the second terminal-conductor line intersects the first active-region structure and is connected to the first power rail through a second via-connector. The second conductor segment of the second terminal-conductor line intersects the second active-region structure and has a distal edge separated along the second direction from the second power rail. A vertical distance along the second direction from a centerline of the first power rail to a proximal edge of the first conductor segment of the first terminal-conductor line is larger than a vertical distance along the second direction from a centerline of the second power rail to a proximal edge of the second conductor segment of the first terminal-conductor line. A vertical distance along the second direction from a centerline of the first power rail to a proximal edge of the first conductor segment of the second terminal-conductor line is smaller than a vertical distance along the second direction from a centerline of the second power rail to a proximal edge of the second conductor segment of the second terminal-conductor line.

Another aspect of the present disclosure relates to a method. The method includes fabricating a first active-region structure and a second active-region structure extending in a first direction, fabricating a first terminal-conductor line and a second terminal-conductor line extending in a second direction perpendicular to the first direction, and etching the first terminal-conductor line and the second terminal-conductor line, by which separating each of the first terminal-conductor line and the second terminal-conductor line into a first conductor segment intersecting the first active-region structure and a second conductor segment intersecting the second active-region structure. The method also includes forming a first power rail and a second power rail extending in the first direction. A vertical distance from a centerline of the first power rail to a proximal edge of the first conductor segment of the first terminal-conductor line is larger than a vertical distance from a centerline of the second power rail to a proximal edge of the second conductor segment of the first terminal-conductor line by a first predetermined vertical distance that is a fraction of a first separation distance separating the first conductor segment and the second conductor segment of the first terminal-conductor line. A vertical distance from the centerline of the first power rail to a proximal edge of the first conductor segment of the second terminal-conductor line is smaller than a vertical distance from the centerline of the second power rail to a proximal edge of the second conductor segment of the second terminal-conductor line by the first predetermined vertical distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first active-region structure and a second active-region structure extending in a first direction perpendicular to a second direction;
   a first terminal-conductor line extending in the second direction while bounded between a first horizontal cell boundary and a second horizontal cell boundary extending in the first direction, the first terminal-conductor line having a first conductor segment and a second conductor segment separated at proximal edges by a first separation distance, wherein the first conductor segment of the first terminal-conductor line intersects the first active-region structure, and wherein the second conductor segment of the first terminal-conductor line intersects the second active-region structure;
   wherein a first vertical distance along the second direction from the first horizontal cell boundary to a proximal edge of the first conductor segment of the first terminal-conductor line is different from a second vertical distance along the second direction from the second horizontal cell boundary to a proximal edge of the second conductor segment of the first terminal-conductor line, and wherein the first vertical distance is larger than the second vertical distance by a first predetermined vertical distance that is a fraction of the first separation distance; and
   wherein a vertical distance along the second direction from the second horizontal cell boundary to a distal edge of the first conductor segment of the first terminal-conductor line is equal to the first separation distance.

2. The integrated circuit of claim 1, further comprising:
   a first power rail and a second power rail extending in the first direction.

3. The integrated circuit of claim 2, further comprising:
   a second terminal-conductor line having a first conductor segment and a second conductor segment separated at proximal edges by the first separation distance and extending in the second direction, wherein the first conductor segment of the second terminal-conductor line intersects the first active-region structure and is connected to the first power rail through a second via-connector, and wherein the second conductor segment of the second terminal-conductor line intersects the second active-region structure and has a distal edge separated along the second direction from the second power rail;
   wherein a third vertical distance along the second direction from a centerline of the first power rail to a proximal edge of the first conductor segment of the second terminal-conductor line is different from a fourth vertical distance along the second direction from the centerline of the second power rail to a proximal edge of the second conductor segment of the second terminal-conductor line; and
   wherein the third vertical distance is smaller than the fourth vertical distance by an amount that is equal to the first predetermined vertical distance.

4. The integrated circuit of claim 3, wherein a vertical distance along the second direction from a centerline of the second power rail to a distal edge of the second conductor segment of the second terminal-conductor line is equal to the first separation distance.

5. The integrated circuit of claim 2, further comprising:
   a third terminal-conductor line having a first conductor segment and a second conductor segment separated at proximal edges by the first separation distance and extending in the second direction, wherein the first conductor segment of the third terminal-conductor line intersects the first active-region structure and has a distal edge separated along the second direction from the first power rail, and wherein the second conductor segment of the third terminal-conductor line intersects the second active-region structure and has a distal edge separated along the second direction from the second power rail;
   wherein a third vertical distance along the second direction from a centerline of the first power rail to a proximal edge of the first conductor segment of the third terminal-conductor line is different from a fourth vertical distance along the second direction from the centerline of the second power rail to a proximal edge of the second conductor segment of the third terminal-conductor line; and
   wherein the third vertical distance is different from the fourth vertical distance by an amount that is equal to the first predetermined vertical distance.

6. The integrated circuit of claim 5, wherein a fifth vertical distance along the second direction from the centerline of the first power rail to a distal edge of the first conductor segment of the third terminal-conductor line is different from a sixth vertical distance along the second direction from the centerline of the second power rail to a distal edge of the second conductor segment of the third terminal-conductor line, and wherein either the fifth vertical distance or the sixth vertical distance is equal to the first separation distance.

7. The integrated circuit of claim 2, further comprising:
   a third terminal-conductor line having a first conductor segment and a second conductor segment separated at proximal edges by a second separation distance and extending in the second direction, wherein the first conductor segment of the third terminal-conductor line intersects the first active-region structure and has a distal edge separated along the second direction from the first power rail, and wherein the second conductor segment of the third terminal-conductor line intersects the second active-region structure and has a distal edge separated along the second direction from the second power rail;
   wherein a third vertical distance along the second direction from a centerline of the first power rail to a proximal edge of the first conductor segment of the third terminal-conductor line is equal to a fourth vertical distance along the second direction from the centerline of the second power rail to a proximal edge of the second conductor segment of the third terminal-conductor line; and wherein the first separation distance is larger than the second separation distance.

8. The integrated circuit of claim 7, wherein a ratio between the first separation distance and the second separation distance is larger than or equal to 1.20.

9. The integrated circuit of claim 7, wherein a fifth vertical distance along the second direction from the centerline of the first power rail to a distal edge of the first conductor segment of the third terminal-conductor line is equal to a sixth vertical distance along the second direction from the centerline of the second power rail to a distal edge of the second conductor segment of the third terminal-conductor line, and wherein each of the fifth vertical distance and the sixth vertical distance is equal to the second separation distance.

10. The integrated circuit of claim 2, further comprising:
a third terminal-conductor line having a first conductor segment and a second conductor segment separated at proximal edges by the first separation distance and extending in the second direction, wherein the first conductor segment of the third terminal-conductor line intersects the first active-region structure and has a distal edge separated along the second direction from the first power rail, and wherein the second conductor segment of the third terminal-conductor line intersects the second active-region structure and has a distal edge separated along the second direction from the second power rail;
wherein a third vertical distance along the second direction from a centerline of the first power rail to a proximal edge of the first conductor segment of the third terminal-conductor line is equal to a fourth vertical distance along the second direction from the centerline of the second power rail to a proximal edge of the second conductor segment of the third terminal-conductor line; and
wherein a fifth vertical distance along the second direction from the centerline of the first power rail to a distal edge of the first conductor segment of the third terminal-conductor line is smaller than the first separation distance, and a sixth vertical distance along the second direction from the centerline of the second power rail to a distal edge of the second conductor segment of the third terminal-conductor line is smaller than the first separation distance.

11. The integrated circuit of claim 10, wherein a cell height measured as a vertical distance along the second direction from the centerline of the first power rail to the centerline of the second power rail is in a range from 4.0H to 6.0H, wherein each of the fifth vertical distance and the sixth vertical distance is in a range from 0.7H to 0.8H, and wherein the first separation distance is in a range from 0.95H to 1.05H.

12. An integrated circuit comprising:
a first power rail and a second power rail extending in a first direction;
a first active-region structure and a second active-region structure extending in the first direction;
a first terminal-conductor line having a first conductor segment and a second conductor segment separated at proximal edges by a first separation distance and extending in a second direction perpendicular to the first direction, wherein the first conductor segment of the first terminal-conductor line intersects the first active-region structure and has a distal edge separated along the second direction from the first power rail, and wherein the second conductor segment of the first terminal-conductor line intersects the second active-region structure and is connected to the second power rail through a first via-connector;
a second terminal-conductor line having a first conductor segment and a second conductor segment separated at proximal edges by the first separation distance and extending in the second direction, wherein the first conductor segment of the second terminal-conductor line intersects the first active-region structure and is connected to the first power rail through a second via-connector, and wherein the second conductor segment of the second terminal-conductor line intersects the second active-region structure and has a distal edge separated along the second direction from the second power rail;
wherein a vertical distance along the second direction from a centerline of the first power rail to a proximal edge of the first conductor segment of the first terminal-conductor line is larger than a vertical distance along the second direction from a centerline of the second power rail to a proximal edge of the second conductor segment of the first terminal-conductor line; and
wherein a vertical distance along the second direction from a centerline of the first power rail to a proximal edge of the first conductor segment of the second terminal-conductor line is smaller than a vertical distance along the second direction from a centerline of the second power rail to a proximal edge of the second conductor segment of the second terminal-conductor line.

13. The integrated circuit of claim 12, further comprising:
a first horizontal cell boundary extending in the first direction and adjoining an outer edge of the second via-connector;
a second horizontal cell boundary extending in the first direction and adjoining an outer edge of the first via-connector;
a third terminal-conductor line having a first conductor segment and a second conductor segment separated at proximal edges by a second separation distance and extending in the second direction, wherein the first conductor segment of the third terminal-conductor line intersects the first active-region structure and has a distal edge separated along the second direction from the first power rail, and wherein the second conductor segment of the third terminal-conductor line intersects the second active-region structure and has a distal edge separated along the second direction from the second power rail;
wherein a vertical distance along the second direction from the first horizontal cell boundary to a proximal edge of the first conductor segment of the second terminal-conductor line is equal to a vertical distance along the second direction from the second horizontal cell boundary to a proximal edge of the second conductor segment of the third terminal-conductor line; and
wherein the first separation distance is larger than the second separation distance.

14. The integrated circuit of claim 12, further comprising:
a first horizontal cell boundary extending in the first direction and adjoining an outer edge of the second via-connector;

a second horizontal cell boundary extending in the first direction and adjoining an outer edge of the first via-connector;

a third terminal-conductor line having a first conductor segment and a second conductor segment separated at proximal edges by the first separation distance and extending in the second direction, wherein the first conductor segment of the third terminal-conductor line intersects the first active-region structure and has a distal edge separated along the second direction from the first power rail, and wherein the second conductor segment of the third terminal-conductor line intersects the second active-region structure and has a distal edge separated along the second direction from the second power rail;

wherein a vertical distance along the second direction from the first horizontal cell boundary to a proximal edge of the first conductor segment of the second terminal-conductor line is equal to a vertical distance along the second direction from the second horizontal cell boundary to a proximal edge of the second conductor segment of the third terminal-conductor line; and wherein a vertical distance along the second direction from the first horizontal cell boundary to a distal edge of the first conductor segment of the third terminal-conductor line is smaller than the first separation distance, and a vertical distance along the second direction from the second horizontal cell boundary to a distal edge of the second conductor segment of the third terminal-conductor line is smaller than the first separation distance.

15. The integrated circuit of claim 12, further comprising:
two vertical cell boundaries extending in the second direction, wherein each of the vertical cell boundaries passes a first cell boundary isolation region in the first active-region structure and a second cell boundary isolation region in the second active-region structure; and wherein the first terminal-conductor line and the second terminal-conductor line are parallelly positioned between the two vertical cell boundaries.

16. A method comprising:
fabricating a first active-region structure and a second active-region structure extending in a first direction;
fabricating a first terminal-conductor line and a second terminal-conductor line extending in a second direction perpendicular to the first direction;
etching the first terminal-conductor line and the second terminal-conductor line, whereby separating each of the first terminal-conductor line and the second terminal-conductor line into a first conductor segment intersecting the first active-region structure and a second conductor segment intersecting the second active-region structure;
forming a first power rail and a second power rail extending in the first direction;
wherein a vertical distance from a centerline of the first power rail to a proximal edge of the first conductor segment of the first terminal-conductor line is larger than a vertical distance from a centerline of the second power rail to a proximal edge of the second conductor segment of the first terminal-conductor line by a first predetermined vertical distance that is a fraction of a first separation distance separating the first conductor segment and the second conductor segment of the first terminal-conductor line; and wherein a vertical distance from the centerline of the first power rail to a proximal edge of the first conductor segment of the second terminal-conductor line is smaller than a vertical distance from the centerline of the second power rail to a proximal edge of the second conductor segment of the second terminal-conductor line by the first predetermined vertical distance.

17. The method of claim 16, further comprising:
fabricating a third terminal-conductor line extending in the second direction;
etching the third terminal-conductor line and separating the third terminal-conductor line into a first conductor segment intersecting the first active-region structure and a second conductor segment intersecting the second active-region structure; and
wherein a vertical distance from the centerline of the first power rail to a proximal edge of the first conductor segment of the third terminal-conductor line is different from a vertical distance from the centerline of the second power rail to a proximal edge of the second conductor segment of the third terminal-conductor line by the first predetermined vertical distance.

18. The method of claim 16, further comprising:
fabricating a third terminal-conductor line extending in the second direction;
etching the third terminal-conductor line and separating the third terminal-conductor line into a first conductor segment intersecting the first active-region structure and a second conductor segment intersecting the second active-region structure; and
wherein a vertical distance from the centerline of the first power rail to a proximal edge of the first conductor segment of the third terminal-conductor line is different from a vertical distance from the centerline of the second power rail to a proximal edge of the second conductor segment of the third terminal-conductor line.

19. The method of claim 16, further comprising:
fabricating a third terminal-conductor line extending in the second direction;
etching the third terminal-conductor line and separating the third terminal-conductor line into a first conductor segment intersecting the first active-region structure and a second conductor segment intersecting the second active-region structure;
wherein a vertical distance from the centerline of the first power rail to a proximal edge of the first conductor segment of the third terminal-conductor line is equal to a vertical distance from the centerline of the second power rail to a proximal edge of the second conductor segment of the third terminal-conductor line.

20. The method of claim 19, wherein the first separation distance separating the first conductor segment and the second conductor segment of the first terminal-conductor line is larger than a second separation distance separating the first conductor segment and the second conductor segment of the third terminal-conductor line.

* * * * *